United States Patent
Harada

(10) Patent No.: US 8,334,597 B2
(45) Date of Patent: *Dec. 18, 2012

(54) SEMICONDUCTOR DEVICE HAVING VIA CONNECTING BETWEEN INTERCONNECTS

(75) Inventor: Takeshi Harada, Niigata (JP)

(73) Assignee: Panasonic Corporation, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/104,484

(22) Filed: May 10, 2011

(65) Prior Publication Data

US 2011/0210445 A1 Sep. 1, 2011

Related U.S. Application Data

(62) Division of application No. 12/607,697, filed on Oct. 28, 2008, now Pat. No. 7,964,969, which is a division of application No. 12/241,896, filed on Sep. 30, 2008, now Pat. No. 7,632,751, which is a division of application No. 11/000,904, filed on Dec. 2, 2004, now Pat. No. 7,439,623.

(30) Foreign Application Priority Data

Dec. 3, 2003 (JP) ................................. 2003-404437

(51) Int. Cl.
*H01L 29/40* (2006.01)
(52) U.S. Cl. ........ 257/758; 257/750; 257/752; 257/773; 257/774; 257/775; 257/776; 257/E23.145; 257/E29.119; 438/598; 438/601; 438/623
(58) Field of Classification Search .................. None
See application file for complete search history.

(56) References Cited

U.S. PATENT DOCUMENTS

| 6,717,267 B1 | 4/2004 | Kunikiyo |
| 6,919,637 B2 | 7/2005 | He et al. |
| 7,439,623 B2 * | 10/2008 | Harada ........................ 257/758 |
| 2002/0145201 A1 | 10/2002 | Armbrust et al. |

FOREIGN PATENT DOCUMENTS

| CN | 1304175 | 7/2001 |
| JP | 2000-012688 | 1/2000 |
| JP | 2000-331991 | 11/2000 |
| JP | 2002-033384 | 1/2002 |
| JP | 2002-299437 | 10/2002 |

OTHER PUBLICATIONS

Translation of Notice of Reasons of Rejection.
Chinese Office Action issued in Chinese Patent Application No. CN200410096561.2, dated Jul. 13, 2007.
U.S. Notice of Allowance issued in U.S. Appl. No. 12/607,697, mailed on Feb. 16, 2011.
U.S. Notice of Allowance issued in U.S. App. No. 12/241,896, mailed on Aug. 18, 2009.
U.S. Notice of Allowance issued in U.S. Appl. No. 11/000,904, mailed on Aug. 1, 2008.

* cited by examiner

*Primary Examiner* — Fernando L Toledo
*Assistant Examiner* — Valerie N Brown
(74) *Attorney, Agent, or Firm* — McDermott Will & Emery LLP

(57) ABSTRACT

A first insulating film is provided between a lower interconnect and an upper interconnect. The lower interconnect and the upper interconnect are connected to each other by way of a via formed in the first insulating film. A dummy via or an insulating slit is formed on/in the upper interconnect near the via.

48 Claims, 18 Drawing Sheets

(w:WIDTH OF INTERCONNECT WHERE VIA IS FORMED)

US 8,334,597 B2

SEMICONDUCTOR DEVICE HAVING VIA CONNECTING BETWEEN INTERCONNECTS

CROSS-REFERENCE TO RELATED APPLICATIONS

This application is a Divisional of U.S. patent application Ser. No. 12/607,697, filed on Oct. 28, 2009, now U.S. Pat. No. 7,964,969, which is a Divisional of U.S. patent application Ser. No. 12/241,896, filed on Sep. 30, 2008, now U.S. Pat. No. 7,632,751, which is a Divisional of U.S. patent application Ser. No. 11/000,904, filed on Dec. 2, 2004, now U.S. Pat. No. 7,439,623, claiming priority of Japanese Patent Application No. 2003-404437, filed on Dec. 3, 2003, the entire contents of each of which are hereby incorporated by reference.

BACKGROUND OF THE INVENTION

The present invention relates to interconnection structures and methods for forming the structures.

To meet recent increase in the speed and integration density of electronic devices such as semiconductor devices, copper (Cu) having low resistance has been more frequently used as an interconnect material.

FIG. 19B is a cross-sectional view showing an example of a conventional multilevel interconnection structure formed by using Cu. As shown in FIG. 19B, a first interconnect 2 is buried in an insulating film 1 formed on a semiconductor substrate (not shown), and a SiN film 3, a $SiO_2$ film 4 and a FSG (fluorine-doped silicate glass, i.e., fluorine-doped silicon oxide) film 5 are formed in this order over the insulating film 1 and the first interconnect 2. A via hole 6 is formed through the $SiO_2$ film 4 and the SiN film 3 to reach the first interconnect 2. An interconnect trench 7 is formed in the FSG film 5 to reach the via hole 6. A barrier film 8 and a Cu film 9 are buried in this order in the via hole 6 and the interconnect trench 7, thereby forming a via 10 and a second interconnect 11 in the via hole 6 and the interconnect trench 7, respectively. A SiN film 12 is formed on the FSG film 5 and the second interconnect 11.

As shown in FIG. 19B, the first interconnect 2 and the second interconnect 11 are electrically connected to each other by way of the via 10. Each of the first interconnect 2 and the second interconnect 11 is electrically connected to another element (now shown) or an external electrode (not shown.) In this manner, the first interconnect 2, the via 10 and the second interconnect 11 constitute part of a closed circuit in actual use.

FIG. 19C is a plan view showing the multilevel interconnection structure shown in FIG. 19B when viewed above. As shown in FIG. 19C, the first interconnect 2 has a width smaller than that of the second interconnect 11. Specifically, the width of the first interconnect 2 is 0.2 µm, the diameter of the via 10 (the via hole 6) is 0.20 µm, and the width of the second interconnect 11 is 10 µm.

FIGS. 18A through 18C and 19A are cross-sectional views showing respective process steps of a conventional method for forming the multilevel interconnection structure shown in FIG. 19B (see Japanese Unexamined Patent Publication (Kokai) No. 2000-331991.)

First, as shown in FIG. 18A, an insulating film 1 is formed on the surface of a semiconductor substrate (not shown), and then a first interconnect 2 is formed in the insulating film 1.

Next, as shown in FIG. 18B, a SiN film 3, a $SiO_2$ film 4 and a FSG film 5 are formed in this order over the insulating film 1 and the first interconnect 2 by a plasma chemical vapor deposition (plasma CVD) process. Thereafter, lithography and dry etching are alternately performed twice (i.e., lithography and dry etching are each performed twice), thereby forming a via hole 6 through the $SiO_2$ film 4 and the SiN film 3 to reach the first interconnect 2 and also forming an interconnect trench 7 in the FSG film 5 to reach the via hole 6.

Then, as shown in FIG. 18C, a barrier film 8 is deposited by a physical vapor deposition (PVD) process to fill the via hole 6 and the interconnect trench 7. Then, a Cu film 9 is formed by a plating process on the barrier film 8 to completely fill the via hole 6 and the interconnect trench 7.

Thereafter, as shown in FIG. 19A, parts of the barrier film 8 and the Cu film 9 extending off the interconnect trench 7 are removed by a chemical/mechanical polishing (CMP) process. In this manner, a second interconnect 11 is formed in the interconnect trench 7, and a via 10 connecting the first interconnect 2 and the second interconnect 11 to each other is formed in the via hole 6.

Lastly, a SiN film 12 is deposited over the FSG film 5 and the second interconnect 11 (the Cu film 9), thus completing the multilevel interconnection structure shown in FIG. 19B.

SUMMARY OF THE INVENTION

However, this conventional multilevel interconnection structure has the following drawbacks. A large number of vacancies are present in the Cu film 9 deposited by plating. When the multilevel interconnection structure is held at high temperature, these vacancies move along the gradient of stress. Specifically, if compressive stress inside the via 10 is higher than compressive stress inside the second interconnect 11, i.e., if tensile stress inside the via 10 is lower than tensile stress inside the second interconnect 11, vacancies flow from the second interconnect 11 into the via 10. In particular, in a multilevel interconnection structure as shown in FIGS. 19B and 19C, the volume of the second interconnect 11 is much greater than that of the via 10, so that a large number of vacancies flow from the second interconnect 11 into the via 10. As a result, as shown in FIG. 20A, plastic deformation occurs in a part of the Cu film 9 constituting the via 10, so that a void 13 is created in the via hole 6. If the electrical connection between the first interconnect 2 and the second interconnect 11 is broken by this void 13, the device malfunctions.

It is therefore an object of the present invention to achieve a highly-reliable multilevel interconnection structure which does not cause malfunction even when the structure is held at high temperature.

To achieve the object, a first interconnection structure according to the present invention includes: a lower interconnect; an upper interconnect; a first insulating film provided between the lower interconnect and the upper interconnect; and a second insulating film provided under the first insulating film, wherein the lower interconnect and the upper interconnect are connected to each other by way of a via formed in the first insulating film, at least one dummy via is connected to the upper interconnect, the lower interconnect is formed in the second insulating film, and the bottom of the dummy via is located in the second insulating film.

In the first interconnection structure, the dummy via is provided on the upper interconnect near the via, so that vacancies in a part of a conductive film constituting the upper interconnect are divided and respectively flow into the via and the dummy via. That is, the dummy via reduces the stress gradient from the upper interconnect to the via. Accordingly, even when the interconnection structure is held at high temperature, flowing of vacancies from the upper interconnect to the via is suppressed. As a result, plastic deformation of a part of the conductive film constituting the via, i.e., occurrence of a void inside the via hole, is suppressed, so that a highly-reliable multilevel interconnection structure which does not cause malfunction even when held at high temperature is implemented.

In addition, in the first interconnection structure, the bottom of the dummy via is located in the second insulating film below the first insulating film. Therefore, a hole for forming the dummy via is deeper than a hole for forming the via (i.e., a via hole.) Accordingly, the stress gradient between the upper interconnect and the dummy via is steeper than that between the upper interconnect and the via. As a result, flowing of vacancies from the part of the conductive film constituting the upper interconnect into the dummy via precedes that into the via. This more effectively suppresses plastic deformation of the part of the conductive film constituting the via, i.e., occurrence of a void in the via hole. As a result, the reliability of the multilevel interconnection structure is further enhanced.

A dummy via and a dummy interconnect herein means a pseudo via or a pseudo interconnect which do not constitute a closed circuit in actual use of a device with an interconnection structure including these via and interconnect (i.e., no current flows therein during actual use of the device.)

In the first interconnection structure, the bottom of the dummy via may be connected to a dummy interconnect formed in the second insulating film. Then, a hole for forming a dummy via is easily formed by etching the first insulating film with the dummy interconnect used as an etching stopper.

In the first interconnection structure, a third insulating film may be formed on the upper interconnect, and the dummy via may be formed in the third insulating film such that the bottom of the dummy via is connected to the upper interconnect.

In the first interconnection structure, the dummy via preferably has a diameter smaller than that of the via.

Then, the diameter of the hole for the dummy via is smaller than that of the hole for the via (i.e., the via hole). In other words, the volume of the dummy via is smaller than that of the via. Accordingly, the stress gradient between the upper interconnect and the dummy via is steeper than that between the upper interconnect and the via. As a result, flowing of vacancies from a part of the conductive film constituting the upper interconnect into the dummy via precedes that into the via. This more effectively suppresses plastic deformation of a part of the conductive film constituting the via, i.e., occurrence of a void in the via hole. As a result, the reliability of the multi-level interconnection structure is further enhanced.

In the first interconnection structure, the dummy via is preferably substantially rectangular in a plan view, and the length of the dummy via and the width of the upper interconnect are provided along the same direction in the plan view.

Then, vacancies which are present in a part of the conductive film constituting the upper interconnect opposite the via with respect to the dummy via flow into the dummy via, so that it is possible to prevent these vacancies from reaching the via. This more effectively suppresses plastic deformation of a part of the conductive film constituting the via, i.e., occurrence of a void in the via hole. As a result, the reliability of the multilevel interconnection structure is further enhanced.

In the first interconnection structure, the via may be substantially circular in a plan view, and the dummy via may have a shape different from that of the via in the plan view.

In the first interconnection structure, the dummy via is preferably closer to a center of the upper interconnect than the via is. In other words, the distance between the via and the end of the upper interconnect opposite the via with respect to the dummy via (which will be also referred to as the end of the upper interconnect toward the dummy via) is preferably longer than the distance between the via and the other end of the upper interconnect, i.e., the end of the upper interconnect toward the via.

Then, the distance between the via and the end of the upper interconnect toward the dummy via is longer than the distance between the via and the other end of the upper interconnect. In other words, a first region in the upper interconnect between the end thereof toward the dummy via and the via is larger than a second region in the upper interconnect between the other end thereof and the via. Therefore, the first region contains a larger number of vacancies than the second region. In addition, the dummy via is provided in this first region, so that vacancies more effectively flow into the dummy via. This more effectively suppresses plastic deformation of a part of the conductive film constituting the via, i.e., occurrence of a void in the via hole. As a result, the reliability of the multilevel interconnection structure is further enhanced.

In the first interconnection structure, the via and the dummy via are preferably spaced at a distance of 1 μm or less.

Then, the effect of making part of vacancies which are to flow into the via flow into the dummy via is ensured. The space between a via (a via hole) and a dummy via (a dummy hole) herein means the space between the edge of the via toward the dummy via and the edge of the dummy via toward the via. The minimum space is set in accordance with the minimum isolation width between interconnects or vias defined by the design rule, for example.

A second interconnection structure according to the present invention includes: a lower interconnect; an upper interconnect; and a first insulating film provided between the lower interconnect and the upper interconnect, wherein the lower interconnect and the upper interconnect are connected to each other by way of a via formed in the first insulating film, and at least one insulating slit is formed in the upper interconnect.

In the second interconnection structure, the insulating slit is provided in the upper interconnect near the via, so that the tensile stress on a part of the upper interconnect near the via is lower than that on the other part of the upper interconnect. That is, the insulating slit reduces the stress gradient from the upper interconnect to the via. Accordingly, even when the interconnection structure is held at high temperature, flowing of vacancies from the upper interconnect toward the via is suppressed. In addition, the insulating slit is made of a material different from that for a conductive film constituting the upper interconnect and the via, so that the insulating slit acts as a barrier against movement of atoms or vacancies in the conductive film. This prevents convection of atoms inside the upper interconnect and the via or accumulation of vacancies on the bottom of the via. As a result, plastic deformation of a part of the conductive film constituting the via, i.e., occurrence of a void inside the via hole, is suppressed, so that a highly-reliable multilevel interconnection structure which does not cause malfunction even when held at high temperature is implemented.

In the second interconnection structure, the insulating slit may be a part of the first insulating film provided between the lower interconnect and the upper interconnect, for example.

In the second interconnection structure, the insulating slit may be in contact with a portion of the upper interconnect connected to the via. In such a case, if the insulating slit is substantially rectangular in a plan view, the length of the insulating slit is greater than or equal to twice and less than or equal to four times as large as the diameter of the via in the plan view, and a longer side of the insulating slit in the plan view is in contact with the portion of the upper interconnect connected to the via, the foregoing advantages are obtained.

In the second interconnection structure, it is preferable that the insulating slit is substantially rectangular in a plan view, the length of the insulating slit is greater than or equal to twice and less than or equal to ten times as large as the diameter of the via in the plan view, and the length of the insulating slit and the width of the upper interconnect are provided along the same direction in the plan view.

Then, even in a case where the insulating slit is apart from a portion of the upper interconnect connected to the via, the following advantage is obtained. Flowing of vacancies which are present in a part of a conductive film constituting the upper interconnect opposite the via with respect to the insulating slit is blocked by the insulating slit, so that these vacancies do not reach the via. In addition, the insulating slit is closer to the center of the upper interconnect than the via is. In other words, the distance between the via and the end of the upper interconnect opposite the via with respect to the insulating slit (which will be also referred to as the end of the upper interconnect toward the insulating slit) is longer than the distance between the via and the other end of the upper interconnect, i.e., the end of the upper interconnect toward the via, so that a first region in the upper interconnect between the end thereof toward the insulating slit and the via is larger than a second region in the upper interconnect between the other end thereof and the via. Therefore, the first region contains a larger number of vacancies than the second region. In addition, the insulating slit is provided in this first region, so that movement of vacancies is more effectively prevented by the insulating slit. This more effectively suppresses plastic deformation of a part of the conductive film constituting the via, i.e., occurrence of a void in the via hole. As a result, the reliability of the multilevel interconnection structure is further enhanced.

In the second interconnection structure, the insulating slit is preferably closer to a center of the upper interconnect than the via is.

In the second interconnection structure, the via and the insulating slit are preferably spaced at a distance of 1 µm or less.

Then, the effect of preventing movement of vacancies which are to flow into the via by using the insulating slit is obtained. The space between a via (a via hole) and an insulating slit herein means the space between the edge of the via toward the insulating slit and the edge of the insulating slit toward the via. As described above, the insulating slit may be in contact with the portion of the upper interconnect connected to the via. In this case, the space between the via and the insulating slit is zero.

A third interconnection structure according to the present invention includes: a lower interconnect; an upper interconnect; and a first insulating film provided between the lower interconnect and the upper interconnect, wherein the lower interconnect and the upper interconnect are connected to each other by way of a via formed in the first insulating film, the upper interconnect is divided into a first interconnect portion having a relatively large interconnect width and a second interconnect portion having a relatively small interconnect width, the via is connected to the second interconnect portion, at least one dummy portion connected to the upper interconnect is provided on the first insulating film, and a distance between the dummy portion and a branch point between the first interconnect portion and the second interconnect portion is smaller than a distance between the dummy portion and an edge of the second interconnect portion opposite to the branch point.

In the third interconnection structure, not only advantages similar to those obtained by the first interconnection structure but also the following advantage is obtained. Vacancies which are to enter a second interconnect portion (a narrow interconnect portion) from a first interconnect portion (a wide interconnect portion) and flow into the via are effectively captured in the dummy portion. As a result, the number of devices malfunctioning when being held at high temperature is further reduced.

In the third interconnection structure, the dummy portion may be connected to the first interconnect portion or the second interconnect portion, and a distance between the dummy portion and the branch point may be smaller than a distance between the dummy portion and an edge of the second interconnect portion opposite to the branch point. The distance between the dummy portion and the branch point may be 1 µm or less. The dummy portion may have a shape similar to that of the via or be substantially rectangular in a plan view.

In the third interconnection structure, if the second interconnect portion has an interconnect width of 0.20 µm or less, the foregoing advantages are more remarkable than those in a conventional interconnection structure.

A first method for forming an interconnection structure according to the present invention includes the steps of depositing a first insulating film on a lower interconnect; forming, in the first insulating film, a via hole reaching the lower interconnect, at least one dummy hole located near the via hole, and an upper interconnect trench connected to the via hole and the dummy hole; and depositing a conductive material in the upper interconnect trench, the via hole and the dummy hole, thereby forming an upper interconnect, a via for connecting the lower interconnect and the upper interconnect to each other, and a dummy via connected to the upper interconnect and insulated from the lower interconnect, wherein the lower interconnect is formed in a second insulating film under the first insulating film, and the dummy hole is formed such that the bottom of the dummy hole is located in the second insulating film.

With the first method, the first interconnection structure according to the present invention is formed, so that advantages similar to those obtained by the first interconnection structure are obtained. To form a via or an upper interconnect, a damascene process such as a dual damascene process or other processes may be used.

A second method for forming an interconnection structure according to the present invention includes the steps of: depositing a first insulating film on a lower interconnect; forming, in the first insulating film, a via hole reaching the lower interconnect and an upper interconnect trench connected to the via hole; depositing a conductive material in the upper interconnect trench and the via hole, thereby forming an upper interconnect and a via for connecting the lower interconnect and the upper interconnect to each other; depositing a second insulating film on the upper interconnect; forming, in the second insulating film, a dummy hole reaching the upper interconnect and located near the via; and depositing a conductive material in the dummy hole, thereby forming at least one dummy via.

With the second method, the first interconnection structure according to the present invention is formed, so that advantages similar to those obtained by the first interconnection structure are obtained. To form a via or an upper interconnect, a damascene process such as a dual damascene process or other processes may be used.

In the first or second method, the via hole and the dummy hole are preferably spaced at a distance of 1 µm or less.

Then, part of vacancies which are to flow into the via flow into the dummy via.

A third method for forming an interconnection structure according to the present invention includes the steps of depositing a first insulating film on a lower interconnect; forming, in the first insulating film, a via hole reaching the lower interconnect and an upper interconnect trench connected to the via hole; and depositing a conductive material in the upper interconnect trench and the via hole, thereby forming an upper interconnect and a via for connecting the lower interconnect and the upper interconnect to each other, wherein the step of forming the via hole and the upper interconnect trench includes the step of leaving part of the first insulating film in the upper interconnect trench near the via hole, thereby forming an insulating slit.

With the third method, the second interconnection structure according to the present invention is formed, so that advantages similar to those obtained by the second interconnection structure are obtained. To form a via or an upper interconnect, a damascene process such as a dual damascene process or other processes may be used.

A fourth method for forming an interconnection structure according to the present invention includes the steps of depositing a first insulating film on a lower interconnect; forming, in the first insulating film, a via hole reaching the lower interconnect, an upper interconnect trench connected to the via hole and divided into a first trench with a relatively large width and a second trench with a relatively small width, and a recess provided near a branch point between the first trench and the second trench; and depositing a conductive material in the upper interconnect trench, the via hole and the recess, thereby forming an upper interconnect, a via for connecting the lower interconnect and the upper interconnect to each other and a dummy portion connected to the upper interconnect and insulated from the lower interconnect, wherein a first interconnect portion constituting the upper interconnect is formed in the first trench and a second interconnect portion constituting the upper interconnect is formed in the second trench.

With the fourth method, the third interconnection structure according to the present invention is formed, so that advantages similar to those obtained by the third interconnection structure are obtained. To form a via or an upper interconnect, a damascene process such as a dual damascene process or other processes may be used.

As described above, according to the present invention, a dummy via or an insulating slit is provided on/in the upper interconnect near via, so that it is possible to prevent flowing of vacancies from an upper interconnect toward a via constituting a closed circuit together with the upper interconnect in actual use. Accordingly, plastic deformation of a part of a conductive film constituting the via, i.e., occurrence of a void in a via hole, is suppressed, resulting in a highly-reliable multilevel interconnection structure. The present invention relates to interconnection structures and methods for forming the structures, and is useful especially when applied to electronic devices such as semiconductor devices.

DESCRIPTION OF THE PREFERRED EMBODIMENTS (Principle of the Present Invention)

First, for a phenomenon in which a void occurs in a via hole in a conventional multilevel interconnection structure, a result of an examination carried out by the present inventor (i.e., a mechanism of this phenomenon) will be described.

Figure 20A:
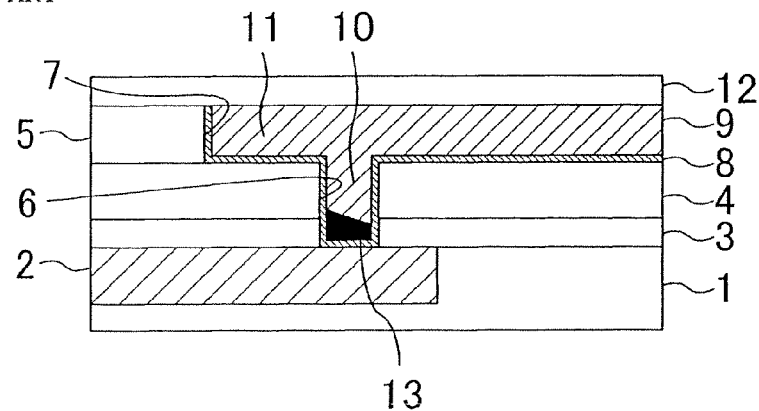
FIG. 20A is a view for explaining problems in the conventional interconnection structure.
Figure 20B:
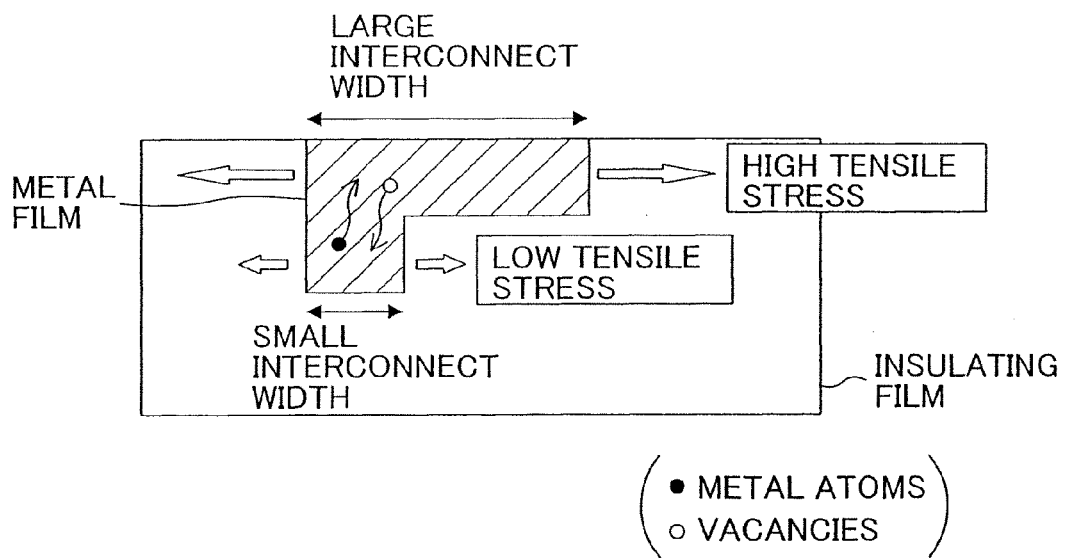
FIG. 20B is an illustration for explaining a result of an examination carried out by the present inventor on problems in the conventional interconnection structure.

A metal film is affected by its surrounding films depending on an interconnection structure including the metal film. For example, as shown in FIG. 20B, a metal film (e.g., a Cu film) formed in part of an interconnect trench with a narrow interconnect width provided in an insulating film is slightly stretched by its surrounding insulating films. That is, this Cu film is under relatively low tensile stress. On the other hand, a Cu film formed in part of the interconnect trench with a wide interconnect width in the insulating film is strongly stretched by its surrounding insulating films. That is, this Cu film is under relatively high tensile stress. Such tensile stress occurs mainly because of the difference in a thermal expansion coefficient between a metal film and an insulating film or because of shrinkage of the metal film resulting from thermal load in a subsequent step. The tensile stress greatly changes depending on the shapes of the interconnect trench and the via hole, the placement density and others.

A metal film made of Cu or another metal generally has a crystal structure in which atoms are relatively regularly arranged immediately after formation of the film. To form a Cu film, which is mainly used as an interconnect material, is generally formed by electroplating. The Cu film formed by electroplating contains a large number of vacancies. In addition, in the interconnection structure shown in FIG. 20B, vacancies contained in the Cu film are more likely to gather in a portion of the Cu film where tensile stress is low than in a portion thereof where tensile stress is high. This is because stress applied from the neighboring insulating films to the crystal structure of the Cu film is relaxed by entering of vacancies into the portion of the Cu film with low tensile stress, i.e., entering of Cu atoms into the portion of the Cu film with high tensile stress.

Accordingly, when the flexibility of Cu atoms and vacancies is enhanced by, for example, application of heat to the interconnection structure, vacancies move along the stress gradient in the Cu film, i.e., move from the portion of the Cu film with high tensile stress to the portion of the Cu film with low tensile stress (where the direction of movement of Cu atoms is opposite to that of vacancies.) As a result, vacancies readily gather in part of the interconnection structure with a narrow interconnect width or the bottom or corners of the interconnect, and thus voids readily occur.

Based on the foregoing finding, the following embodiments of the present invention are made to implement a technical idea in which the stress gradient in a conductive film serving as an interconnect is reduced so as to suppress the movement of vacancies in the conductive film and thereby to avoid occurrence of a void in the interconnect after formation thereof.

Embodiment 1

A Case where a Via and a Dummy Via are Provided in the Same Layer (Basic Structure)

Hereinafter, an interconnection structure and a method for forming the structure according to a first embodiment of the present invention will be described with reference to the drawings.

Figure 2A:
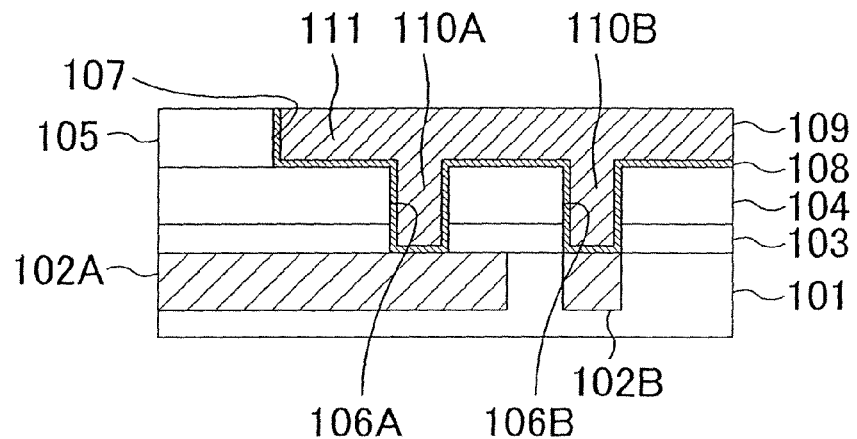
FIGS. 2A and 2B are cross-sectional views showing respective process steps of the method for forming the interconnection structure of the first embodiment.
Figure 2B:
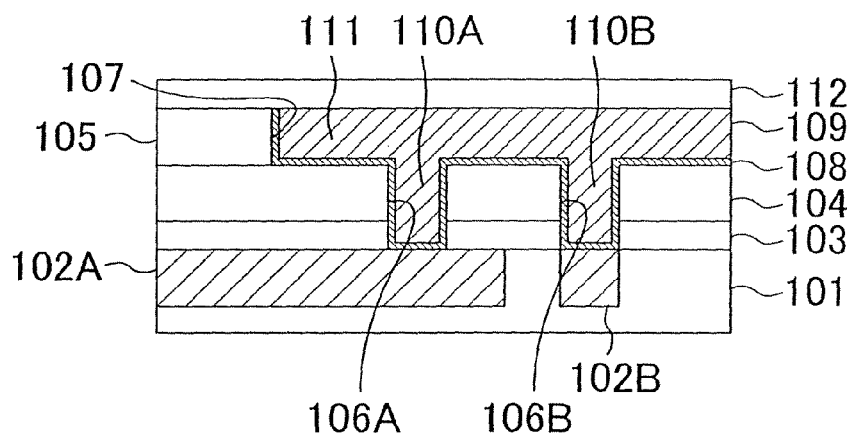

FIG. 2B is a cross-sectional view showing the interconnection structure of the first embodiment. As shown in FIG. 2B, a first interconnect 102A and a dummy interconnect 102B are buried in an insulating film 101 formed on the semiconductor substrate (not shown). A SiN film 103, a SiO$_2$ film 104 and an FSG film 105 are stacked over the insulating film 101, the first interconnect 102A and the dummy interconnect 102B. A via hole 106A and a dummy via hole (dummy hole) 106B are formed in the SiO$_2$ film 104 and the SiN film 103 to reach the first interconnect 102A and the dummy interconnect 102B, respectively. An interconnect trench 107 is formed in the FSG film 105 to be connected to the via hole 106A and the dummy hole 106B. A barrier film 108 and a Cu film 109 are buried in this order in the via hole 106A, the dummy hole 106B and the interconnect trench 107, thereby forming a via 110A, a dummy via 110B, and a second interconnect 111 in the via hole 106A, the dummy hole 106B and the interconnect trench 107, respectively. The dummy via 110B is connected to the second interconnect 111 near the via 110A. A SiN film 112 is formed on the FSG film 105 and the second interconnect 111.

As shown in FIG. 2B, the first interconnect 102A and the second interconnect 111 are electrically connected to each other by way of the via 110A. Each of the first interconnect 102A and the second interconnect 111 is electrically connected to another element (now shown) or an external electrode (not shown.) In this manner, the first interconnect 102A, the via 110A and the second interconnect 111 constitute part of a closed circuit in actual use. On the other hand, neither the dummy interconnect 102B nor the dummy via 110B constitutes a closed circuit in actual use. That is, even if the dummy interconnect 102B and the dummy via 110B are omitted in the interconnection structure shown in FIG. 2B, a device with this interconnection structure is operable at least immediately after fabrication.

Figure 2C:
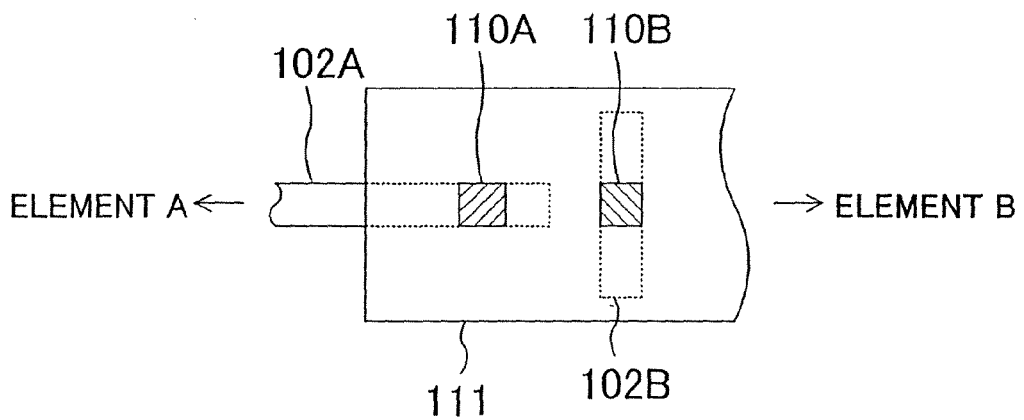
FIG. 2C is a plan view showing the interconnection structure of the first embodiment.

FIG. 2C is a plan view showing the multilevel interconnection structure shown in FIG. 2B when viewed above. As shown in FIG. 2C, in this embodiment, each of the first interconnect 102A and the dummy interconnect 102B has a width smaller than that of the second interconnect 111. Specifically, the width of each of the first interconnect 102A and the dummy interconnect 102B is, for example, 0.2 μm, the diameter of each of the via 110A (the via hole 106A) and the dummy via 110B (the dummy hole 106B) is, for example, 0.20 μm, and the width of the second interconnect 111 is, for example, 10 μm. The space between the via 110A and the dummy via 110B, more specifically, the space between the edge of the via 110A toward the dummy via 110B and the edge of the dummy via 110B toward the via 110A is 0.2 μm, for example. In the present invention, if the planar shape (the shape in plan view) of a via (via hole) is a circle, the diameter of the via (via hole) is the diameter of this circle whereas if the planar shape of the via (via hole) is a square, the diameter of the via (via hole) is the length of a side of this square.

FIGS. 1A through 1C and FIG. 2A are cross-sectional views showing respective process steps of a method for forming the multilevel interconnection structure shown in FIG. 2B according to the first embodiment.

Figure 1A:
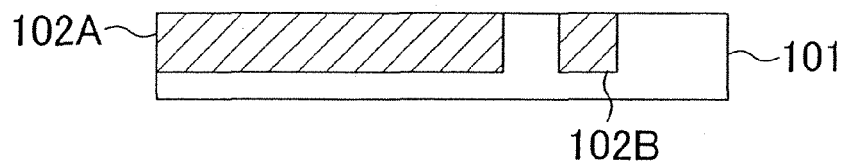
FIGS. 1A through 1C are cross-sectional views showing respective process steps of a method for forming an interconnection structure according to a first embodiment of the present invention.

First, as shown in FIG. 1A, an insulating film 101 is formed on the surface of a semiconductor substrate (not shown), and then a first interconnect 102A and a dummy interconnect 102B are formed in the insulating film 101.

Figure 1B:
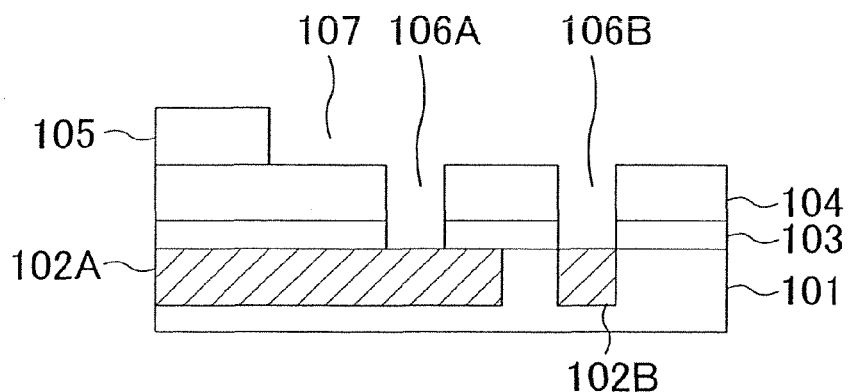

Next, as shown in FIG. 1B, a SiN film 103, a SiO$_2$ film 104 and a FSG film 105 are formed in this order over the insulating film 101, the first interconnect 102A and the dummy interconnect 102B by a plasma CVD process, for example. Thereafter, lithography and dry etching are alternately performed twice (i.e., lithography and dry etching are each performed twice), thereby forming a via hole 106A and a dummy hole 106B in the SiO$_2$ film 104 and the SiN film 103 to reach the first interconnect 102A and the dummy interconnect 102B, respectively, and also forming an interconnect trench 107 in the FSG film 105 to reach the via hole 106A and the dummy hole 106B.

Figure 1C:
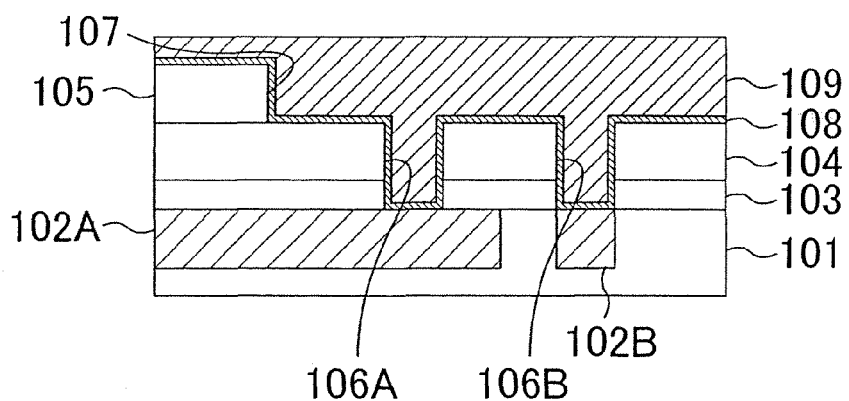

Then, as shown in FIG. 1C, a barrier film 108 is deposited by a PVD process, for example, to partly fill the via hole 106A, the dummy hole 106B and the interconnect trench 107. Then, a Cu film 109 is formed by a plating process, for example, on the barrier film 108 to completely fill the via hole 106A, the dummy hole 106B and the interconnect trench 107.

Thereafter, as shown in FIG. 2A, parts of the barrier film 108 and the Cu film 109 extending off the interconnect trench 107 are removed by a CMP process, for example. In this manner, a second interconnect 111 is formed in the interconnect trench 107. In addition, a via 110A is formed in the via hole 106A to connect the first interconnect 102A and the second interconnect 111 to each other, and a dummy via 110B is formed in the dummy hole 106B to connect the dummy interconnect 102B and the second interconnect 111 to each other. The dummy via 110B is not connected to the first interconnect 102A.

Lastly, a SiN film 112 is deposited over the FSG film 105 and the second interconnect 111 (the Cu film 109), thus completing the multilevel interconnection structure shown in FIG. 2B.

With the foregoing interconnection structure and the method for forming the structure according to the first embodiment, a highly-reliable multilevel interconnection structure which does not cause malfunction even when held at high temperature is implemented. This is because of the following reasons. The dummy via 110B is provided on the second interconnect 111 near the via 110A, so that vacancies in a part of the conductive film (the Cu film 109) constituting the second interconnect 111 are divided and respectively flow into the via 110A and the dummy via 110B. That is, the dummy via 110B reduces the number of vacancies flowing into each via so that the stress gradient from the second interconnect 111 to the via 110A is reduced. Accordingly, even when the interconnection structure is held at high temperature, flowing of vacancies from the second interconnect 111 into the via 110A is suppressed. As a result, plastic deformation of a part of the conductive film (the Cu film 109) constituting the via 110A, i.e., occurrence of a void inside the via hole 106A, is suppressed, so that a highly-reliable multilevel interconnection structure which does not cause malfunction even when held at high temperature is implemented.

In the first embodiment, the dummy interconnect 102B is provided under the dummy via 110B (the dummy hole 106B). Accordingly, the dummy hole 106B is easily formed by etching the SiO$_2$ film 104 and the SiN film 103 with the dummy interconnect 102B used as an etching stopper.

In the first embodiment, the space between the via 110A and the dummy via 110B (i.e., the space between the via hole 106A and the dummy hole 106B: hereinafter referred to as a via-to-dummy via space) is preferably as small as possible. To obtain the effect of reducing the number of vacancies flowing into the via 110A by using the dummy via 110B, the via-to-dummy via space is preferably 25 µm or less and is more preferably 1 µm or less. The minimum via-to-dummy via space can be set in accordance with the minimum isolation width (e.g., 0.2 µm) between interconnects or vias defined by the design rule, for example. If the minimum isolation width between interconnects is set substantially equal to the minimum interconnect width, the minimum via-to-dummy via space may be set in accordance with the minimum interconnect width.

Figure 3:
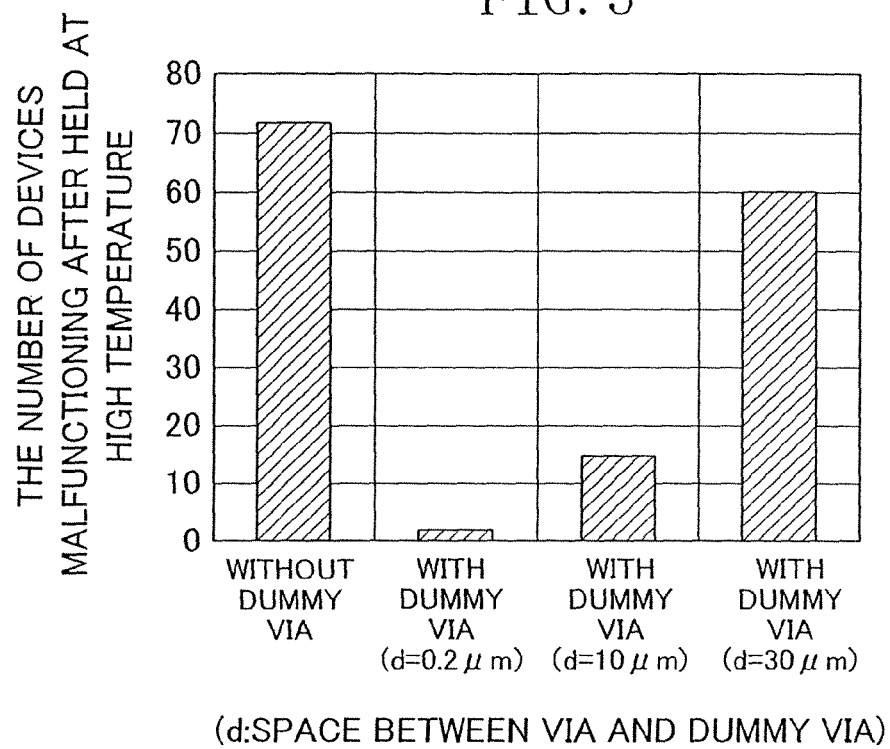
FIG. 3 is a graph showing how an effect achieved by the first embodiment (i.e., the effect of suppressing malfunction after a device has been held at high temperature) depends on a via-to-dummy via space.

FIG. 3 shows how an effect achieved by the present invention (i.e., the effect of suppressing malfunction after a device has been held at high temperature) depends on a via-to-dummy via space. In FIG. 3, the ordinate indicates "the number of devices malfunctioning after being held at high temperature" and the abscissa indicates "via-to-dummy via space (µm)". The "without dummy via" in the abscissa corresponds to a case where the via-to-dummy via space is unlimited. As shown in FIG. 3, as the via-to-dummy via space decreases, the number of malfunctioning devices decreases. In other words, the effect of the present invention becomes remarkable. This is because as the via-to-dummy via space decreases, vacancies which are to gather in the via are more likely to be absorbed in the dummy via.

However, as shown in FIG. 3, when the via-to-dummy via space is 30 µm or more, it is difficult to effectively suppress occurrence of a void in the via by using the dummy via. This is because of the following reason. Vacancies moves within a limited range and therefore it is difficult for the dummy via to absorb vacancies which are to enter the via when the via-to-dummy via space is large. Accordingly, when the via-to-dummy via space is large, especially when the via-to-dummy via space greatly exceeds 30 µm, the incidence of voids is substantially equal to that in the case of "without dummy via". As a result, the number of devices malfunctioning after being held at high temperature is not sufficiently reduced.

In the first embodiment, the number of dummy vias 110B provided for one via 110A is preferably as large as possible. Specifically, it is preferable to provide dummy vias 110B as many as possible on a part of the second interconnect 111 where the dummy vias 110B do not affect circuit operation.

Modified Example of Embodiment 1

Hereinafter, an interconnection structure and a method for forming the structure according to a modified example of the first embodiment will be described with reference to the drawings.

Figure 4:
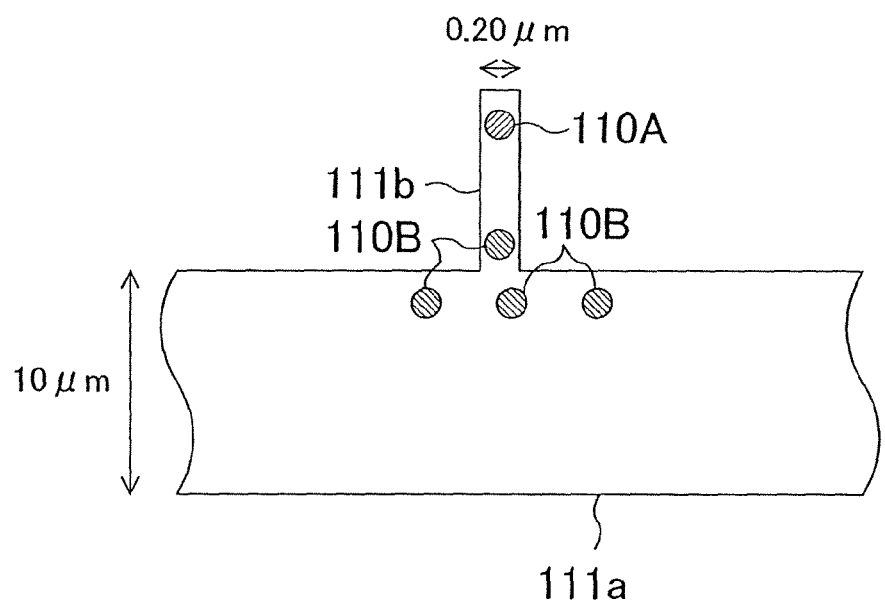
FIG. 4 is a plan view showing an interconnection structure according to a modified example of the first embodiment.

FIG. 4 is a plan view showing the interconnection structure of the modified example of the first embodiment.

As shown in FIG. 4, this modified example is different from the first embodiment (see FIG. 2C) in the following ways. First, the second interconnect 111 includes: a wide interconnect portion 111a having a width of 10 µm, for example; and a narrow interconnect portion 111b having a width of 0.20 µm, for example, and branching off from the wide interconnect portion 111a. Second, the via 110A (the via hole 106A) is connected to the narrow interconnect portion 111b. Third, a plurality of dummy vias 110B (the dummy holes 106B) are connected to the branch point between the wide interconnect portion 111a and the narrow interconnect portion 111b and to portions of the wide interconnect portion 111a near the branch point.

That is, the method for forming the interconnection structure according to this modified example is different from that of the first embodiment in that in the process step shown in FIG. 1B, the interconnect trench 107 divided into a first trench with a relatively large width is formed and a second trench with a relatively small width and the dummy holes 106B are also formed near the branch point between the first trench and the second trench.

In this modified example, not only the advantages obtained by the first embodiment but also the following advantage is obtained. Vacancies which are to enter the narrow interconnect portion 111b from the wide interconnect portion 111a and flow into the via 110A are effectively captured in the dummy vias 110B. As a result, the number of devices malfunctioning when being held at high temperature is further reduced.

In this modified example, one or more dummy vias 110B (dummy holes 106B) may be connected to the branch point between the wide interconnect portion 111a and the narrow interconnect portion 111b or portions of the wide interconnect portion 111a near the branch point. However, the dummy vias 110B are not necessarily provided only at the branch point or its neighboring portions. For example, if a dummy via 110B is located in part of the narrow interconnect portion 111b relatively near the wide interconnect portion 111a, most of vacancies which are to enter the via 110A are captured in the dummy via 110B before reaching the via 110A. Accordingly, it is possible to prevent occurrence of a void in the via 110A.

In this modified example, the distance between the branch point and each of the dummy vias 110B is preferably smaller than the distance between an edge of the wide interconnect portion 111a opposite to the branch point and each of the dummy vias 110B.

In this modified example, dummy vias 110B each having substantially the same shape as that of the via 110A in plan view are provided. Alternatively, dummy portions each having a shape (e.g., a rectangle) different from that of the via 110A in plan view may be provided.

Figure 5:
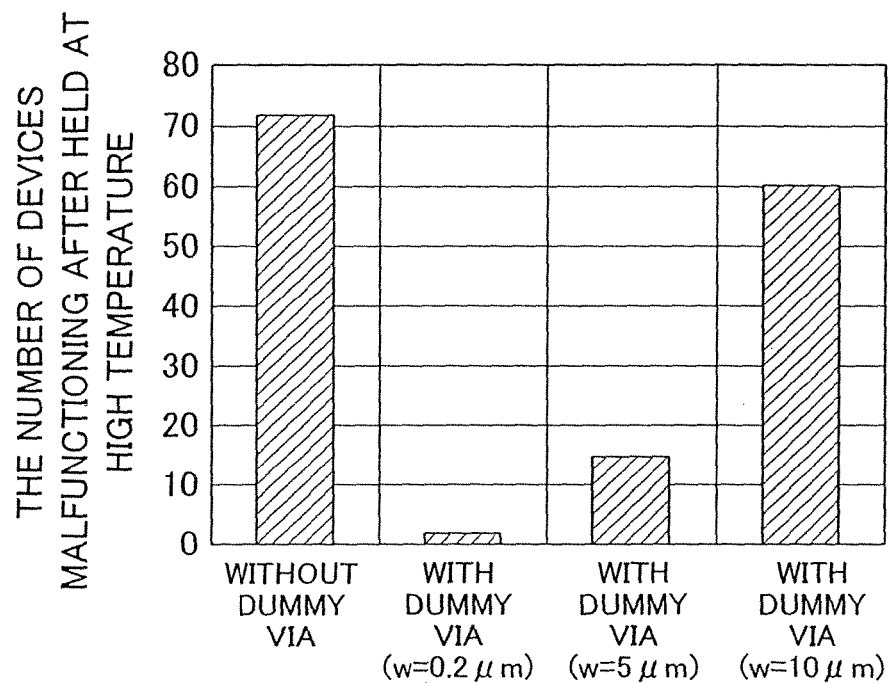
FIG. 5 is a graph showing how an effect achieved by the modified example of the first embodiment (i.e., the effect of suppressing malfunction after a device has been held at high temperature) depends on an interconnect width (i.e., the width of a narrow interconnect on which a via is formed.)

FIG. 5 shows how an effect achieved by the dummy via 110B of this modified example (i.e., a dummy portion formed in part of the wide interconnect portion 111a near the branch point, for example) depends on a via-formed interconnect width (i.e., the width of the narrow interconnect portion 111b where the via 110A is formed.) In FIG. 5, the ordinate indicates "the number of devices malfunctioning after being held at high temperature" and the abscissa indicates "via-formed interconnect width (μm)". The "without dummy via" in the abscissa corresponds to a case where no dummy via 110B is provided on the wide interconnect portion 111a near the branch point. As shown in FIG. 5, in a case where the width of the interconnect portion 111b on which the via 110A is formed is about 10 μm, i.e., the width of the interconnect portion 111b is substantially equal to that of the interconnect portion 111a to which the interconnect portion 111b is connected, even if a dummy via (dummy portion) is formed near the branch point between these interconnect portions, the number of malfunctioning devices does not change greatly. That is, if the width of the interconnect portion 111b on which the via 110A is formed is relatively large, the interconnect portion 111b contains a large amount of metal. Accordingly, this interconnect portion 111b is likely to contain a large number of defects such as voids caused by the presence of metal. As a result, the number of malfunctioning devices is relatively large depending on the amount of metal contained in the interconnect portion 111b.

On the other hand, as the width of the interconnect portion 111b on which the via 110A is formed decreases, the amount of metal contained in the interconnect portion 111b decreases. Accordingly, the number of defects occurring in the interconnect portion 111b due to the presence of metal slightly decreases. However, as the interconnect portion 111b becomes narrower, the diameter of the via 110A provided on the interconnect portion 111b decreases, so that defects such as voids are more likely to concentrate in the via 110A. In view of this, as shown in FIG. 4, the dummy via (dummy portion) 110B is formed near the branch point between the narrow interconnect portion 111b on which the via 110A is formed and the wide interconnect portion 111a. In this manner, the incidence of malfunction is reduced in accordance with reduction of the interconnect width of the narrow interconnect portion 111b, as shown in FIG. 5. This is because the number of defects occurring in the metal film decreases with reduction of the interconnect width and, in addition, defects which are to concentrate in the via are absorbed in the dummy vias in advance. Specifically, as the width of the interconnect portion 111b on which the via 110A is formed decreases, i.e., the diameter of the via 110A decreases, a larger number of defects are absorbed in the dummy vias 110B. This absorbing effect is remarkable especially when the width of the narrow interconnect portion 111b is about 0.20 μm or less, as shown in FIG. 5.

Embodiment 2

A Case where a Via and a Dummy Via are Provided in the Same Layer (Without a Dummy Interconnect)

Hereinafter, an interconnection structure and a method for forming the structure according to a second embodiment of the present invention will be described with reference to the drawings.

Figure 7A:
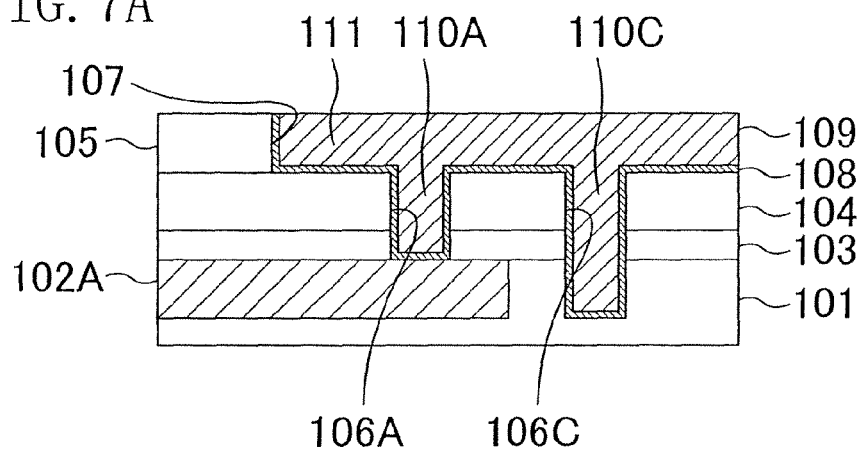
FIGS. 7A and 7B are cross-sectional views showing respective process steps of the method for forming the interconnection structure of the second embodiment.
Figure 7B:
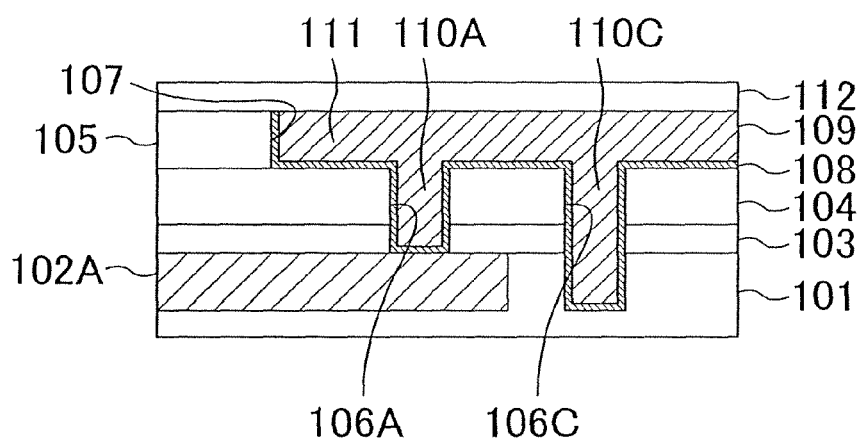
Figure 7C:
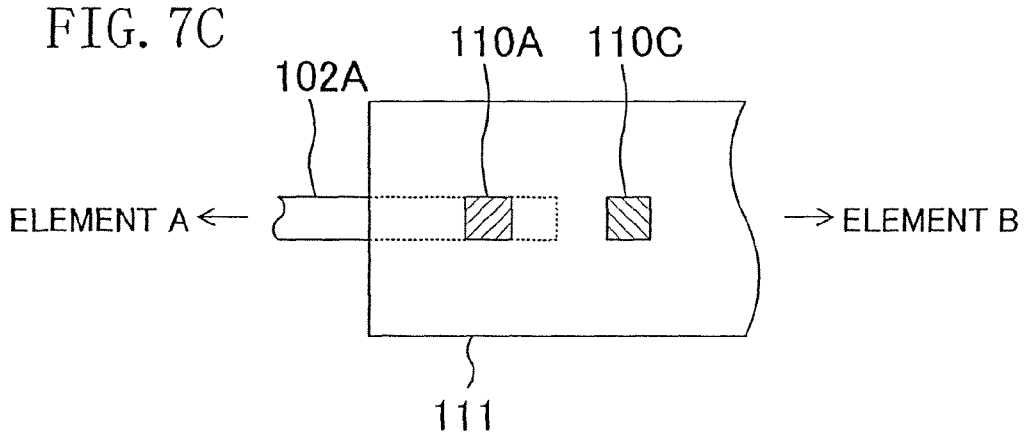
FIG. 7C is a plan view showing the interconnection structure of the second embodiment.

FIG. 7B is a cross-sectional view showing the interconnection structure of the second embodiment. FIG. 7C is a plan view showing the multilevel interconnection structure shown in FIG. 7B when viewed from above. In FIGS. 7B and 7C, components already described in the first embodiment with reference to FIGS. 1A through 1C and 2A through 2C are denoted by the same reference numerals, and detailed description thereof will be omitted.

As shown in FIGS. 7B and 7C, the second embodiment is different from the first embodiment in the following ways. The dummy interconnect 102B is not provided, a dummy hole 106C deeper than the dummy hole 106B is provided instead of the dummy hole 106B, and a dummy via 110C is formed in the dummy hole 106C instead of the dummy via 110B. That is, the bottom of the dummy via 110C (the dummy hole 106C) is located in an insulating film 101, and the dummy hole 106C is deeper than a via hole 106A.

In this embodiment, the dummy via 110C is also connected to a second interconnect 111 near the via 110A.

As shown in FIG. 7B, the dummy via 110C does not constitute a closed circuit in actual use. In other words, even if the dummy hole 106C is omitted in the interconnection structure shown in FIG. 7B, a device with this interconnection structure is operable at least immediately after fabrication.

In addition, in this embodiment, a first interconnect 102A has a width smaller than that of the second interconnect 111, as shown in FIG. 7C. Specifically, the width of the first interconnect 102A is, for example, 0.2 μm, the diameter of each of the via 110A (the via hole 106A) and the dummy via 110C (the dummy hole 106C) is, for example, 0.20 μm, and the width of the second interconnect 111 is, for example, 10 μm. The space between the via 110A and the dummy via 110C, more specifically, the space between the edge of the via 110A toward the dummy via 110C and the edge of the dummy via 110C toward the via 110A is 0.2 μm, for example.

FIGS. 6A through 6C and 7A are cross-sectional views showing respective process steps of a method for forming the multilevel interconnection structure shown in FIG. 7B according to the second embodiment.

Figure 6A:
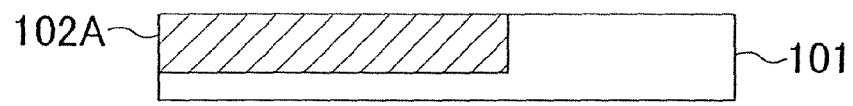
FIGS. 6A through 6C are cross-sectional views showing respective process steps of a method for forming an interconnection structure according to a second embodiment of the present invention.

First, as shown in FIG. 6A, an insulating film 101 is formed on the surface of a semiconductor substrate (not shown), and then a first interconnect 102A is formed in the insulating film 101.

Figure 6B:
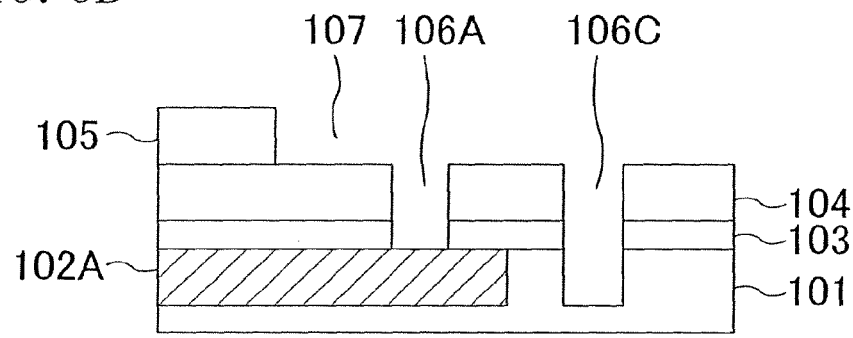

Next, as shown in FIG. 6B, a SiN film 103, a SiO₂ film 104 and a FSG film 105 are formed in this order over the insulating film 101 and the first interconnect 102A by a plasma CVD process, for example. Thereafter, lithography and dry etching are alternately performed twice (i.e., lithography and dry etching are each performed twice), thereby forming a via hole 106A in the SiO₂ film 104 and the SiN film 103 to reach the first interconnect 102A and also forming a dummy hole 106C in the SiO₂ film 104, the SiN film 103 and the insulating film 101. In addition, an interconnect trench 107 is formed in the FSG film 105 to reach the via hole 106A and the dummy hole 106C.

Figure 6C:
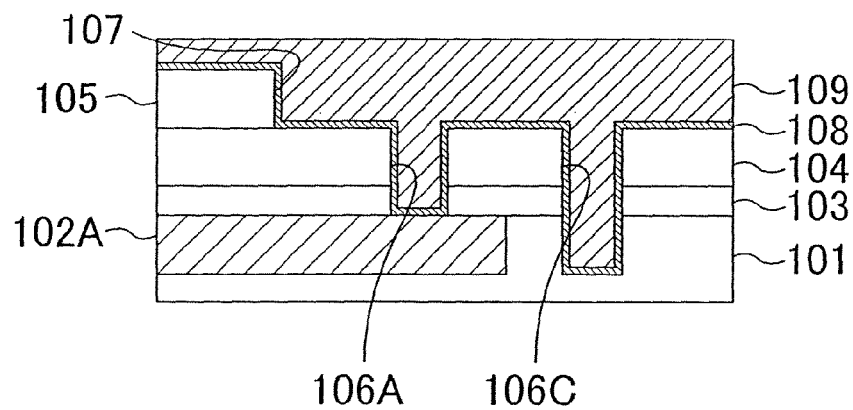

Then, as shown in FIG. 6C, a barrier film 108 is deposited by a PVD process, for example, to partly fill the via hole 106A, the dummy hole 106C and the interconnect trench 107. Then, a Cu film 109 is formed by a plating process, for example, on the barrier film 108 to completely fill the via hole 106A, the dummy hole 106C and the interconnect trench 107.

Thereafter, as shown in FIG. 7A, parts of the barrier film 108 and the Cu film 109 extending of the interconnect trench 107 are removed by a CMP process, for example. In this manner, a second interconnect 111 is formed in the interconnect trench 107. In addition, a via 110A is formed in the via hole 106A to connect the first interconnect 102A and the second interconnect 111 to each other. A dummy via 110C connected only to the second interconnect 111 is formed in the dummy hole 106C. In other words, the dummy via 110C is not connected to the first interconnect 102A.

Lastly, a SiN film 112 is deposited over the FSG film 105 and the second interconnect 111 (the Cu film 109), thus completing the multilevel interconnection structure shown in FIG. 7B.

With the foregoing interconnection structure and the method for forming the structure according to the second embodiment, a highly-reliable multilevel interconnection structure which does not cause malfunction even when held at high temperature is implemented. This is because of the following reasons. The dummy via 110C is provided on the second interconnect 111 near the via 110A, so that vacancies in a part of the conductive film (the Cu film 109) constituting the second interconnect 111 are divided and respectively flow into the via 110A and the dummy via 110C. That is, the dummy via 110C reduces the number of vacancies flowing into each via so that the stress gradient from the second interconnect 111 to the via 110A is reduced. Accordingly, even when the interconnection structure is held at high temperature, flowing of vacancies from the second interconnect 111 into the via 110A is suppressed. As a result, plastic deformation of a part of the conductive film (the Cu film 109) constituting the via 110A, i.e., occurrence of a void inside the via hole 106A, is suppressed, so that a highly-reliable multilevel interconnection structure which does not cause malfunction even when held at high temperature is implemented.

In the second embodiment, the resultant multilevel interconnection structure is more reliable than that obtained in the first embodiment. This is because of the following reasons. In this embodiment, the dummy hole 106C is deeper than the via hole 106A. Accordingly, the stress gradient between the second interconnect 111 and the dummy via 110C is steeper than that between the second interconnect 111 and the via 110A, so that flowing of vacancies from the part of the conductive film (the Cu film 109) constituting the second interconnect 111 into the dummy via 110C precedes that into the via 110A. This more effectively suppresses plastic deformation of the part of the conductive film (the Cu film 109) constituting the via 110A, i.e., occurrence of a void in the via hole 106A. As a result, the resultant multilevel interconnection structure is more reliable than that obtained in the first embodiment.

In the second embodiment, the space between the via 110A and the dummy via 110C (i.e., the space between the via hole 106A and the dummy hole 106C: hereinafter referred to as a via-to-dummy via space) is preferably as small as possible. To obtain the effect of reducing the number of vacancies flowing into the via 110A by using the dummy via 110C, the via-to-dummy via space is preferably 25 μm or less and is more preferably 1 μm or less. Then, the effect of making part of vacancies which are to flow into the via 110A flow into the dummy via 110C is ensured. The minimum via-to-dummy via space can be set in accordance with the minimum isolation width (e.g., 0.2 μm) between interconnects or vias defined by the design rule, for example. If the minimum isolation width between interconnects is set substantially equal to the minimum interconnect width, the minimum via-to-dummy via space may be set in accordance with the minimum interconnect width.

In the second embodiment, the number of dummy vias 110C provided for one via 110A is preferably as large as possible. Specifically, it is preferable to provide dummy vias 110C as many as possible on a part of the second interconnect 111 where the dummy vias 110C do not affect circuit operation.

In addition, in the second embodiment, if the second interconnect 111 includes a wide interconnect portion having a width of, for example, about 10 μm and a narrow interconnect portion having a width of, for example, about 0.20 μm or less and branching off from the wide interconnect portion and if the via 110A (the via hole 106A) is connected to the narrow interconnect portion, one or more dummy vias 110C (dummy holes 106C) are preferably connected to the branch point between the wide interconnect portion and the narrow interconnect portion or to part of the wide interconnect portion near the branch point. Then, vacancies which are to enter the narrow interconnect portion from the wide interconnect portion and flow into the via 110A are effectively captured in the dummy vias 110C. The dummy vias 110C are not necessarily provided only at the branch point or its neighboring portions. For example, if a dummy via 110C is located in part of the narrow interconnect portion relatively near the wide interconnect portion, most of vacancies which are to enter the via 110A are captured in the dummy via 110C before reaching the via 110A. Accordingly, it is possible to prevent occurrence of a void in the via 110A. As a result, the number of devices malfunctioning when held at high temperature is further reduced.

Embodiment 3

A Case where a Via and a Dummy Via are Provided in the Same Layer (With a Smaller Dummy Via)

Hereinafter, an interconnection structure and a method for forming the structure according to a third embodiment of the present invention will be described with reference to the drawings.

Figure 8A:
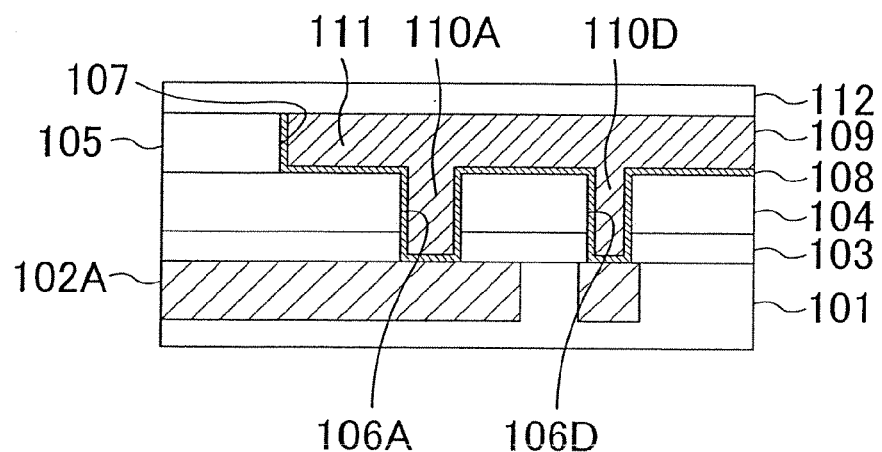
FIG. 8A is a cross-sectional view showing an interconnection structure according to a third embodiment of the present invention.
Figure 8B:
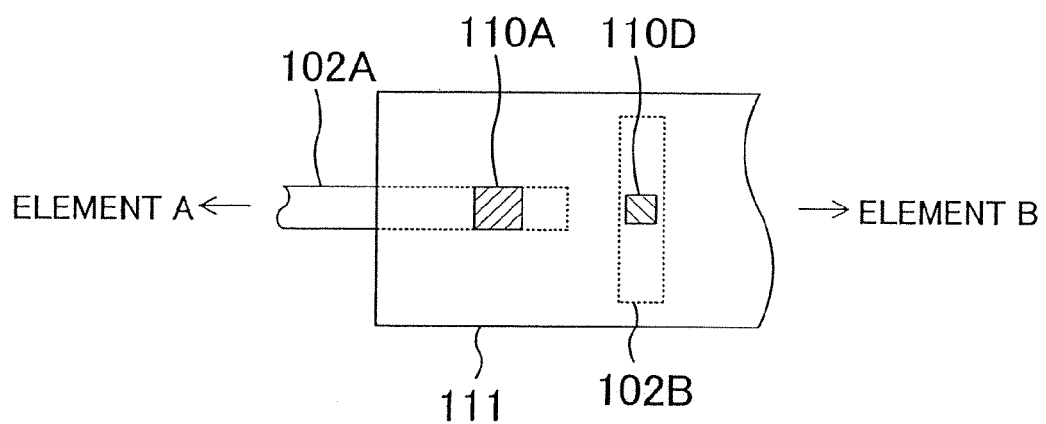
FIG. 8B is a plan view showing the interconnection structure of the third embodiment.

FIG. 8A is a cross-sectional view showing the interconnection structure of the third embodiment. FIG. 8B is a plan view showing the multilevel interconnection structure shown in FIG. 8A when viewed from above. In FIGS. 8A and 8B, components already described in the first embodiment with reference to FIGS. 1A through 1C and 2A through 2C are denoted by the same reference numerals, and detailed description thereof will be omitted.

As shown in FIGS. 8A and 8B, the third embodiment is different from the first embodiment in the following ways. Instead of the dummy hole 106B, a dummy hole 106D with a diameter smaller than that of the dummy hole 106B is provided and a dummy via 110D is provided in the dummy hole 106D instead of the dummy via 110B. That is, in this embodiment, the diameter of the dummy hole 106D (the dummy via 110D) is smaller that of a via hole 106A (a via 110A).

In this embodiment, the dummy via 110D is connected to a second interconnect 111 near the via 110A.

As shown in FIG. 8A, neither a dummy interconnect 102B nor the dummy via 110D constitutes a closed circuit in actual use. In other words, even if the dummy via 110D is omitted in the interconnection structure shown in FIG. 8A, a device with this interconnection structure is operable at least immediately after fabrication.

In addition, in this embodiment, the width of each of a first interconnect 102A and the dummy interconnect 102B is smaller than that of the second interconnect 111, as shown in FIG. 8B. Specifically, the width of each of the first interconnect 102A and the dummy interconnect 102B is, for example, 0.2 µm, the diameter of the via 110A (the via hole 106A) is, for example, 0.20 µm, the diameter of the dummy via 110D (the dummy hole 106D) is, for example, 0.16 µm, and the width of the second interconnect 111 is, for example, 10 µm. The space between the via 110A and the dummy via 110D, more specifically, the space between the edge of the via 110A toward the dummy via 110D and the edge of the dummy via 110D toward the via 110A is 0.24 µm, for example.

A method for forming the multilevel interconnection structure shown in FIG. 8A according to the third embodiment is different from that of the first embodiment (shown in FIGS. 1A through 1C, 2A and 2B) only in that the dummy hole 106D reaching the dummy interconnect 102B and having a diameter smaller than that of the dummy hole 106B is formed instead of the dummy hole 106B in the process step shown in FIG. 1B. That is, the layout of a mask pattern for forming the dummy hole only needs to be changed.

With the foregoing interconnection structure and the method for forming the structure according to the third embodiment, a highly-reliable multilevel interconnection structure which hardly causes malfunction even when held at high temperature is implemented. This is because of the following reasons. The dummy via 110D is provided on the second interconnect 111 near the via 110A, so that vacancies in a part of the conductive film (the Cu film 109) constituting the second interconnect 111 are divided and respectively flow into the via 110A and the dummy via 110D. That is, the dummy via 110D reduces the number of vacancies flowing into each via so that the stress gradient from the second interconnect 111 to the via 110A is reduced. Accordingly, even when the interconnection structure is held at high temperature, flowing of vacancies from the second interconnect 111 into the via 110A is suppressed. As a result, plastic deformation of a part of the conductive film (the Cu film 109) constituting the via 110A, i.e., occurrence of a void inside the via hole 106A, is suppressed, so that a highly-reliable multilevel interconnection structure which hardly causes malfunction even when held at high temperature is implemented.

In the third embodiment, the resultant multilevel interconnection structure is more reliable than that obtained in the first embodiment. This is because of the following reasons. In this embodiment, the diameter of the dummy hole 106D (the dummy via 110D) is smaller than that of the via hole 106A (the via 110A). In other words, the volume of the dummy via 110D is smaller than that of the via 110A. Accordingly, the stress gradient between the second interconnect 111 and the dummy via 110D is steeper than that between the second interconnect 111 and the via 110A, so that flowing of vacancies from the part of the conductive film (the Cu film 109) constituting the second interconnect 111 into the dummy via 110D precedes that into the via 110A. This more effectively suppresses plastic deformation of the part of the conductive film (the Cu film 109) constituting the via 110A, i.e., occurrence of a void in the via hole 106A. As a result, the resultant multilevel interconnection structure is more reliable than that obtained in the first embodiment.

In addition, in the third embodiment, the dummy interconnect 102B is provided under the dummy via 110D (the dummy hole 106D). Accordingly, the dummy hole 106D is easily formed by etching the SiO₂ film 104 and the SiN film 103 with the dummy interconnect 102B used as an etching stopper.

In the third embodiment, the space between the via 110A and the dummy via 110D (i.e., the space between the via hole 106A and the dummy hole 106D: hereinafter referred to as a via-to-dummy via space) is preferably as small as possible. To obtain the effect of reducing the number of vacancies flowing into the via 110A by using the dummy via 110D, the via-to-dummy via space is preferably 25 µm or less and is more preferably 1 µm or less. Then, part of vacancies which are to flow into the via 110A flow into the dummy via 110D. The minimum via-to-dummy via space can be set in accordance with the minimum isolation width (e.g., 0.2 µm) between interconnects or vias defined by the design rule, for example. If the minimum isolation width between interconnects is set substantially equal to the minimum interconnect width, the minimum via-to-dummy via space may be set in accordance with the minimum interconnect width.

In the third embodiment, the number of dummy vias 110D provided for one via 110A is preferably as large as possible. Specifically, it is preferable to provide dummy vias 110D as many as possible on a part of the second interconnect 111 where the dummy vias 110D do not affect circuit operation.

In addition, in the third embodiment, if the second interconnect 111 includes a wide interconnect portion having a width of, for example, about 10 µm and a narrow interconnect portion having a width of, for example, about 0.20 µm or less and branching off from the wide interconnect portion and if the via 110A (the via hole 106A) is connected to the narrow interconnect portion, one or more dummy vias 110D (dummy holes 106D) are preferably connected to the branch point between the wide interconnect portion and the narrow interconnect portion or to part of the wide interconnect portion near the branch point. Then, vacancies which are to enter the narrow interconnect portion from the wide interconnect portion and flow into the via 110A are effectively captured in the dummy via 110D. The dummy vias 110D are not necessarily provided only at the branch point or its neighboring portions. For example, if a dummy via 110D is located on the narrow interconnect portion relatively near the wide interconnect portion, most of vacancies which are to enter the via 110A are captured in the dummy via 110D before reaching the via 110A. Accordingly, it is possible to prevent occurrence of a void in the via 110A. As a result, the number of devices malfunctioning when held at high temperature is further reduced.

Moreover, in the third embodiment, instead of the dummy interconnect 102B, the dummy via 110D (the dummy hole 106D) may be formed such that the bottom of the dummy via 110D is located in the insulating film 101. Then, the dummy hole 106D is deeper than the via hole 106A. This makes the stress gradient between the second interconnect 111 and the dummy via 110D much steeper than that between the second interconnect 111 and the via 110A as compared to the first embodiment. Accordingly, flowing of vacancies from the part of the conductive film (the Cu film 109) constituting the second interconnect 111 into the dummy via 110D precedes that into the via 110A. This more effectively suppresses plastic deformation of the part of the conductive film (the Cu film 109) constituting the via 110A, i.e., occurrence of a void in the via hole 106A. As a result, the reliability of the resultant multilevel interconnection structure is further enhanced.

Embodiment 4

A Case where a Via and a Dummy Via are Provided in the Same Layer (Where the Shape of a Dummy Via is Changed)

Hereinafter, an interconnection structure and a method for forming the structure according to a fourth embodiment of the present invention will be described with reference to the drawings.

Figure 9A:
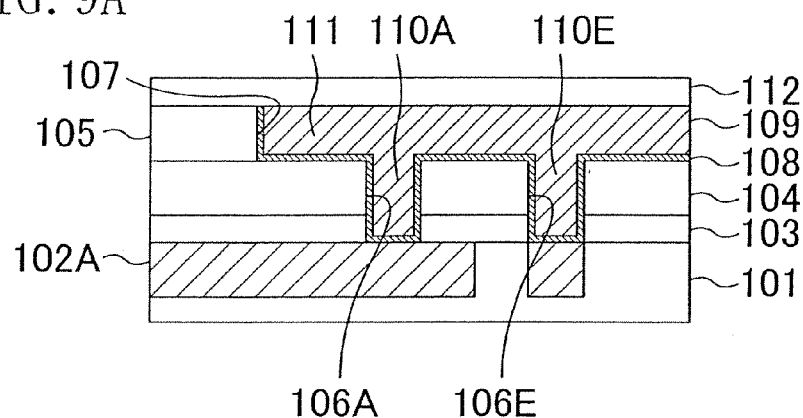
FIG. 9A is a cross-sectional view showing an interconnection structure according to a fourth embodiment of the present invention.
Figure 9B:
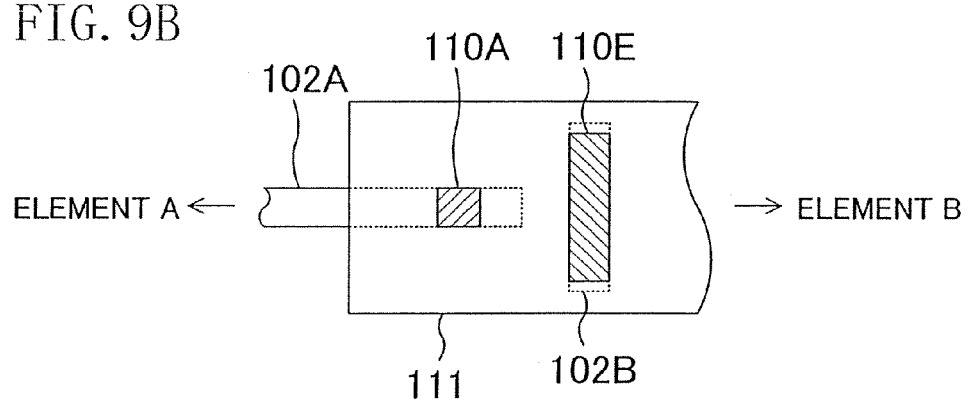
FIG. 9B is a plan view showing the interconnection structure of the fourth embodiment.

FIG. 9A is a cross-sectional view showing the interconnection structure of the fourth embodiment. FIG. 9B is a plan view showing the multilevel interconnection structure shown in FIG. 9A when viewed from above. In FIGS. 9A and 9B, components already described in the first embodiment with reference to FIGS. 1A through 1C and 2A through 2C are denoted by the same reference numerals, and detailed description thereof will be omitted.

As shown in FIGS. 9A and 9B, the fourth embodiment is different from the first embodiment in the following ways. Instead of the dummy hole 106B, a dummy trench 106E which has a shape different from that of the dummy hole 106B (i.e., the via hole 106A), more specifically, which is longer than the via hole 106A in a plan view, is provided. In addition, instead of the dummy via 110B, a dummy portion 110E is provided in the dummy trench 106E. The dummy trench 106E (the dummy portion 110E) is rectangular, for example, in the plan view. The length (i.e., the longer sides) of the dummy portion 110E and the width (i.e., the shorter sides) of a second interconnect 111 are provided along the same direction in the plan view. The dummy portion 110E is connected to the second interconnect 111 near a via 110A (the via hole 106A). The dummy portion 110E is closer to the center of the second interconnect 111 than the via 110A is. In other words, the distance between the via 110A and the end of the second interconnect 111 opposite the via 110A with respect to the dummy portion 110E is longer than the distance between the via 110A and the other end of the second interconnect 111, i.e., the end of the second interconnect 111 toward the via 110A.

As shown in FIG. 9A, neither the dummy interconnect 102B nor the dummy portion 110E constitutes a closed circuit in actual use. In other words, even if the dummy portion 110E is omitted in the interconnection structure shown in FIG. 9A, a device with this interconnection structure is operable at least immediately after fabrication.

In addition, in this embodiment, the width of each of a first interconnect 102A and a dummy interconnect 102B is smaller than that of the second interconnect 111, as shown in FIG. 9B. Specifically, the width of each of the first interconnect 102A and the dummy interconnect 102B is, for example, 0.2 µm, the diameter of the via 110A (the via hole 106A) is, for example, 0.20 µm, the length and width of the rectangular dummy portion 110E (the dummy trench 106E) are, for example, 0.8 µm and 0.20 µm, respectively, and the width of the second interconnect 111 is, for example, 10 µm. The space between the via 110A and the dummy portion 110E, more specifically, the space between the edge of the via 110A toward the dummy portion 110E and the edge of the dummy portion 110E toward the via 110A is 0.2 µm, for example.

A method for forming the multilevel interconnection structure shown in FIG. 9A according to the fourth embodiment is different from that of the first embodiment (shown in FIGS. 1A through 1C, 2A and 2B) only in that the dummy trench 106E reaching the dummy interconnect 102B and having a rectangular shape in a plan view is formed instead of the dummy hole 106B in the process step shown in FIG. 1B. That is, the layout of a mask pattern for forming the dummy hole only needs to be changed.

With the foregoing interconnection structure and the method for forming the structure according to the fourth embodiment, a highly-reliable multilevel interconnection structure which does not cause malfunction even when held at high temperature is implemented. This is because of the following reasons. The dummy portion 110E is provided on the second interconnect 111 near the via 110A, so that vacancies in a part of a conductive film (a Cu film 109) constituting the second interconnect 111 are divided and respectively flow into the via 110A and the dummy portion 110E. That is, the dummy portion 110E reduces the number of vacancies flowing into each via so that the stress gradient from the second interconnect 111 to the via 110A is reduced. Accordingly, even when the interconnection structure is held at high temperature, flowing of vacancies from the second interconnect 111 into the via 110A is suppressed. As a result, plastic deformation of a part of the conductive film (the Cu film 109) constituting the via 110A, i.e., occurrence of a void inside the via hole 106A, is suppressed, so that a highly-reliable multilevel interconnection structure which hardly causes malfunction even when held at high temperature is implemented.

In the fourth embodiment, the resultant multilevel interconnection structure is more reliable than that obtained in the first embodiment. This is because of the following reasons. In this embodiment, the dummy trench 106E (the dummy portion 110E) is longer than the via hole 106A (the via 110A) in a plan view and the length of the dummy portion 110E and the width of the second interconnect 111 are provided along the same direction in the plan view. Accordingly, vacancies which are present in a part of the conductive film (the Cu film 109) constituting the second interconnect 111 opposite the via 110A with respect to the dummy portion 110E flow into the dummy portion 110E, so that it is possible to prevent these vacancies from reaching the via 110A. This more effectively suppresses plastic deformation of the part of the conductive film (the Cu film 109) constituting the via 110A, i.e., occurrence of a void in the via hole 106A. As a result, the resultant multilevel interconnection structure is more reliable than that obtained in the first embodiment.

In addition, in the fourth embodiment, the dummy portion 110E is closer to the center of the second interconnect 111 than the via 110A is. In other words, the distance between the via 110A and the end of the second interconnect 111 opposite the via 110A with respect to the dummy portion 110E is longer than the distance between the via 110A and the other end of the second interconnect 111, i.e., the end of the second interconnect 111 toward the via 110A. Accordingly, the following advantage is obtained. A first region in the second interconnect 111 between the via 110A and the end of the second interconnect 111 toward the dummy portion 110E is larger than a second region in the second interconnect 111 between the other end thereof and the via 110A, so that the first region contains a larger number of vacancies than the second region. The dummy portion 110E is provided on this first region in the second interconnect 111, and thus vacancies more effectively flow into the dummy portion 110E. This more effectively suppresses plastic deformation of the part of the conductive film (the Cu film 109) constituting the via 110A, i.e., occurrence of a void in the via hole 106A. As a result, the reliability of the resultant multilevel interconnection structure is further enhanced.

In addition, in the fourth embodiment, the dummy interconnect 102B is provided under the dummy portion 110E (the dummy trench 106E). Accordingly, the dummy trench 106E is easily formed by etching the $SiO_2$ film 104 and the SiN film 103 with the dummy interconnect 102B used as an etching stopper.

In the fourth embodiment, the space between the via 110A and the dummy portion 110E (i.e., the space between the via hole 106A and the dummy trench 106E: hereinafter referred to as a via-to-dummy via space) is preferably as small as possible. To obtain the effect of reducing the number of vacancies flowing into the via 110A by using the dummy portion 110E, the via-to-dummy via space is preferably 25 μm or less and is more preferably 1 μm or less. Then, the effect of making part of vacancies which are to flow into the via 110A flow into the dummy portion 110E is ensured. The minimum via-to-dummy via space can be set in accordance with the minimum isolation width (e.g., 0.2 μm) between interconnects or vias defined by the design rule, for example. If the minimum isolation width between interconnects is set substantially equal to the minimum interconnect width, the minimum via-to-dummy via space may be set in accordance with the minimum interconnect width.

In the fourth embodiment, the number of dummy portions 110E provided for one via 110A is preferably as large as possible. Specifically, it is preferable to provide dummy portions 110E as many as possible on a part of the second interconnect 111 where the dummy portions 110E do not affect circuit operation.

In the fourth embodiment, the dummy interconnect 102B is not necessarily provided, and the dummy portion 110E (the dummy trench 106E) may be formed instead such that the bottom thereof is located in the insulating film 101.

In the fourth embodiment, the planar shape of the via hole 106A (the via 110A) different from that of the dummy trench 106E (the dummy portion 110E) is not limited specifically, and may be a circle or a square, for example.

Modified Example of Embodiment 4

Hereinafter, an interconnection structure and a method for forming the structure according to a modified example of the fourth embodiment will be described with reference to the drawings.

Figure 10:
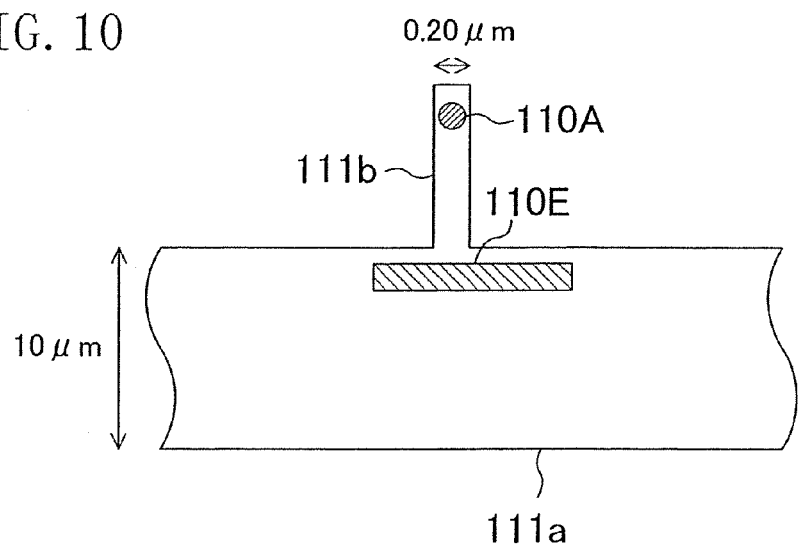
FIG. 10 is a plan view showing an interconnection structure according to a modified example of the fourth embodiment.

FIG. 10 is a plan view showing the interconnection structure according to the modified example of the fourth embodiment.

As shown in FIG. 10, this modified example is different from the fourth embodiment (see FIG. 9B) in the following ways. First, the second interconnect 111 includes: a wide interconnect portion 111a having a width of 10 μm, for example; and a narrow interconnect portion 111b having a width of 0.20 μm, for example, and branching off from the wide interconnect portion 111a. Second, the via 110A (the via hole 106A) is connected to the narrow interconnect portion 111b. Third, the dummy portion 110E (the dummy trench 106E) is connected to the wide interconnect portion 111a near the branch point between the wide interconnect portion 111a and the narrow interconnect portion 111b. In a case where the narrow interconnect portion 111b extends from a longer side of the wide interconnect portion 111a as in this modified example, the length of the dummy portion 110E and the length of the wide interconnect portion 111a are provided along the same direction in the plan view, as shown in FIG. 10.

That is, the method for forming the interconnection structure according to this modified example is different from that of the fourth embodiment in that in the process step shown in FIG. 1B, the interconnect trench 107 divided into a first trench with a relatively large width and a second trench with a relatively small width is formed and the dummy trench 106E is also formed near the branch point between the first trench and the second trench.

In this modified example, not only the advantages obtained by the fourth embodiment but also the following advantage is obtained. Vacancies which are to enter the narrow interconnect portion 111b from the wide interconnect portion 111a and flow into the via 110A are effectively captured in the dummy portion 110E. As a result, the number of devices malfunctioning when being held at high temperature is further reduced.

In addition, the advantage of this modified example obtained by using the dummy portion 110E (i.e., suppression of malfunction after a device has been held at high temperature) is remarkable especially when the width of the narrow interconnect portion 111b is about 0.20 μm or less, as in the modified example of the first embodiment.

Embodiment 5

A Case where a Via and a Dummy Via are Provided in Different Layers

Hereinafter, an interconnection structure and a method for forming the structure according to a fifth embodiment of the present invention will be described with reference to the drawings.

Figure 13A:
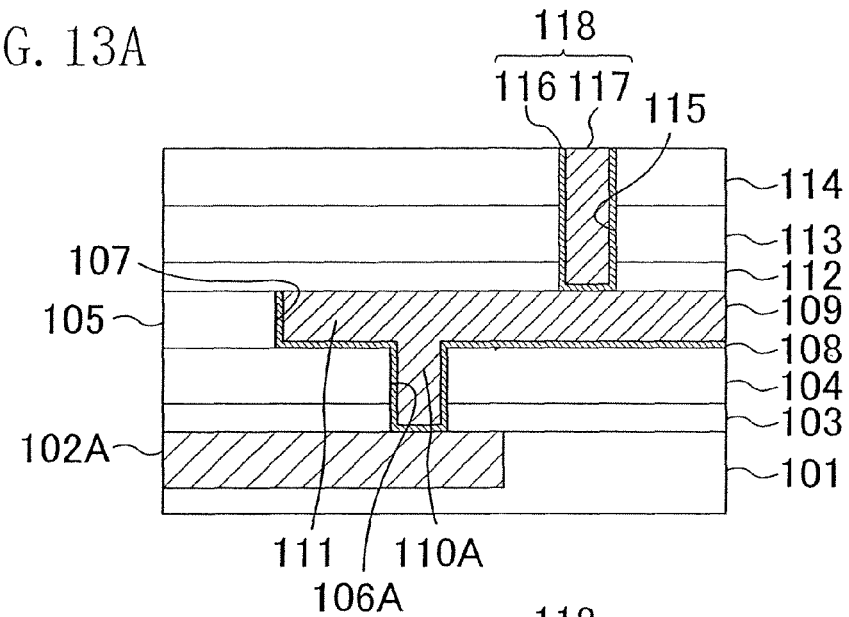
FIGS. 13A and 13B are cross-sectional views showing respective process steps of the method for forming the interconnection structure of the fifth embodiment.
Figure 13B:
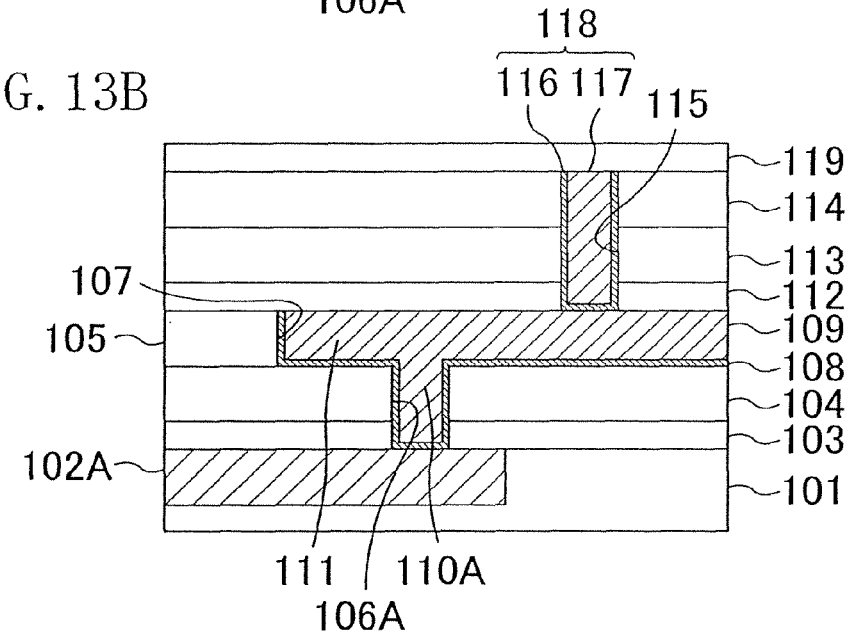
Figure 13C:
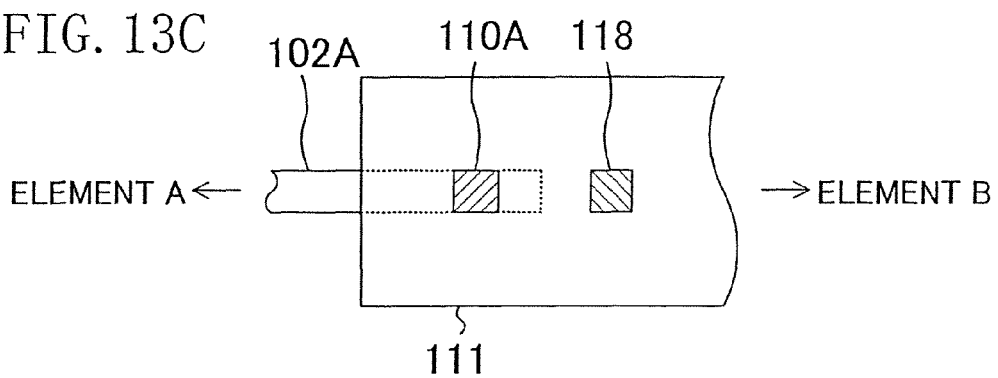
FIG. 13C is a plan view showing the interconnection structure of the fifth embodiment.

FIG. 13B is a cross-sectional view showing the interconnection structure of the fifth embodiment. FIG. 13C is a plan view showing the multilevel interconnection structure shown in FIG. 13B when viewed from above. In FIGS. 13B and 13C, components already described in the first embodiment with reference to FIGS. 1A through 1C and 2A through 2C or the second embodiment with reference to FIGS. 6A through 6C and 7A through 7C, for example, are denoted by the same reference numerals, and detailed description thereof will be omitted.

As shown in FIGS. 13B and 13C, a first interconnect 102A is buried in an insulating film 101 formed on a semiconductor substrate (not shown), and a SiN film 103, a $SiO_2$ film 104 and an FSG film 105 are formed in this order over the insulating film 101 and the first interconnect 102A. A via hole 106A is formed through the $SiO_2$ film 104 and the SiN film 103 to reach the first interconnect 102A. An interconnect trench 107 is formed through the FSG film 105 to reach the via hole 106A. A barrier film 108 and a Cu film 109 are buried in this order in the via hole 106A and the interconnect trench 107, thereby forming a via 100A and a second interconnect 111 in the via hole 106A and the interconnect trench 107, respectively.

A SiN film 112, a $SiO_2$ film 113 and an FSG film 114 are formed over the FSG film 105 and the second interconnect 111. A dummy via hole (dummy hole) 115 is formed through the FSG film 114, the $SiO_2$ film 113 and the SiN film 112 to reach the second interconnect 111. A barrier film 116 and a Cu film 117 are buried in this order in the dummy hole 115, thereby forming a dummy via 118 in the dummy hole 115. The dummy via 118 is connected to the second interconnect 111 near the via 110A. A SiN film 119 is formed over the FSG film 114 and the dummy via 118.

As described above, this embodiment is greatly different from the first through fourth embodiments in that the dummy hole 115 (the dummy via 118) is not provided under the second interconnect 111 but is provided above the second interconnect 111.

As shown in FIG. 13B, the dummy via 118 does not constitute any closed circuit in actual use. In other words, even if the dummy via 118 is omitted in the interconnection structure shown in FIG. 13B, a device with this interconnection structure is operable at least immediately after fabrication.

In addition, as shown in FIG. 13C, in this embodiment, the first interconnect 102A has a width smaller than that of the second interconnect 111. Specifically, the width of the first interconnect 102A is, for example, 0.2 µm, the diameter of each of the via 110A (the via hole 106A) and the dummy via 118 (the dummy hole 115) is, for example, 0.20 µm, and the width of the second interconnect 111 is, for example, 10 µm. The space between the via 110A and the dummy via 118, more specifically, the space between the edge of the via 110A toward the dummy via 118 and the edge of the dummy via 118 toward the via 110A is 0.2 for example.

FIGS. 11A through 11C, 12A through 12C and 13A are cross-sectional views showing respective process steps of a method for forming the multilevel interconnection structure shown in FIG. 13B according to the fifth embodiment.

Figure 11A:
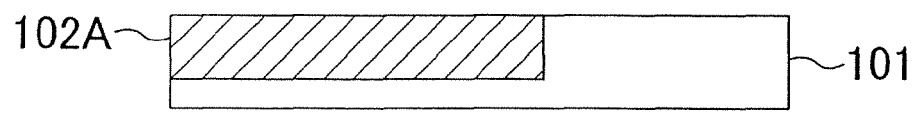
FIGS. 11A through 11C are cross-sectional views showing respective process steps of a method for forming an interconnection structure according to a fifth embodiment of the present invention.

First, as shown in FIG. 11A, an insulating film 101 is formed on the surface of a semiconductor substrate (not shown), and then a first interconnect 102A is formed in the insulating film 101.

Figure 11B:
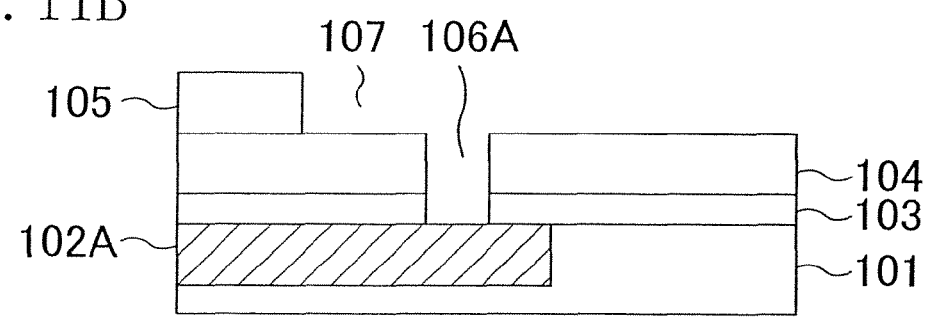

Next, as shown in FIG. 11B, a SiN film 103, a SiO₂ film 104 and a FSG film 105 are formed in this order over the insulating film 101 and the first interconnect 102A by a plasma CVD process, for example. Thereafter, lithography and dry etching are alternately performed twice (i.e., lithography and dry etching are each performed twice), thereby forming a via hole 106A in the SiO₂ film 104 and the SiN film 103 to reach the first interconnect 102A and also forming an interconnect trench 107 in the FSG film 105 to reach the via hole 106A.

Figure 11C:
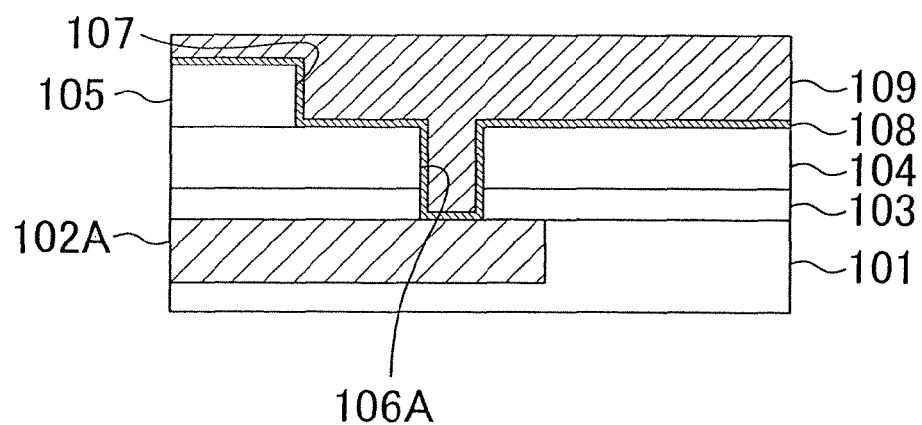

Then, as shown in FIG. 11C, a barrier film 108 is deposited by a PVD process, for example, to partly fill the via hole 106A and the interconnect trench 107. Then, a Cu film 109 is formed by a plating process, for example, on the barrier film 108 to completely fill the via hole 106A and the interconnect trench 107.

Figure 12A:
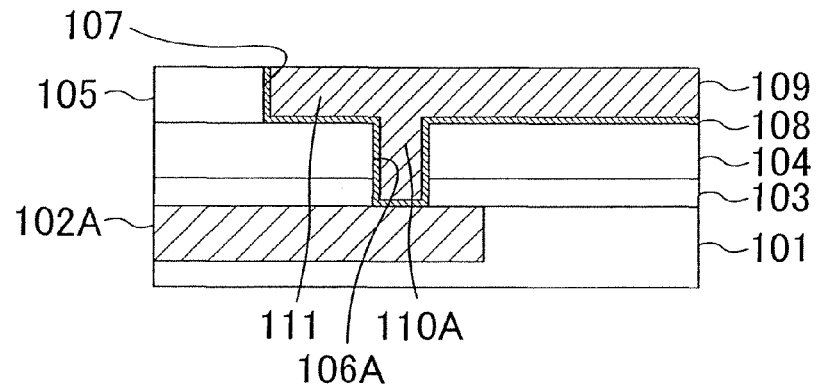
FIGS. 12A through 12C are cross-sectional views showing respective process steps of the method for forming the interconnection structure of the fifth embodiment.

Thereafter, as shown in FIG. 12A, parts of the barrier film 108 and the Cu film 109 extending off the interconnect trench 107 are removed by a CMP process, for example. In this manner, a second interconnect 111 is formed in the interconnect trench 107. In addition, a via 110A is formed in the via hole 106A to connect the first interconnect 102A and the second interconnect 111 to each other.

Figure 12B:
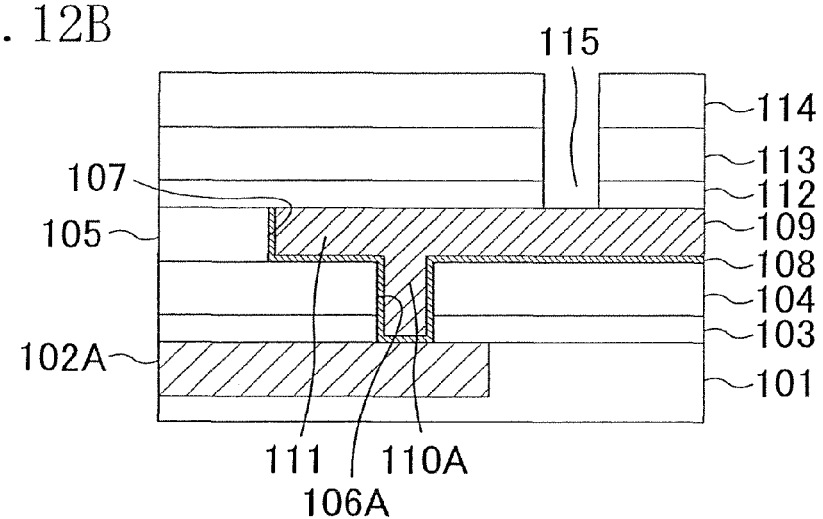

Subsequently, as shown in FIG. 12B, a SiN film 112, a SiO₂ film 113 and an FSG film 114 are formed in this order by, for example, a plasma CVD process over the FSG film 105 and the second interconnect 111. Thereafter, lithography and dry etching are performed, and thereby a dummy hole 115 is formed through the FSG film 114, the SiO₂ film 113 and the SiN film 112 to reach the second interconnect 111.

Figure 12C:
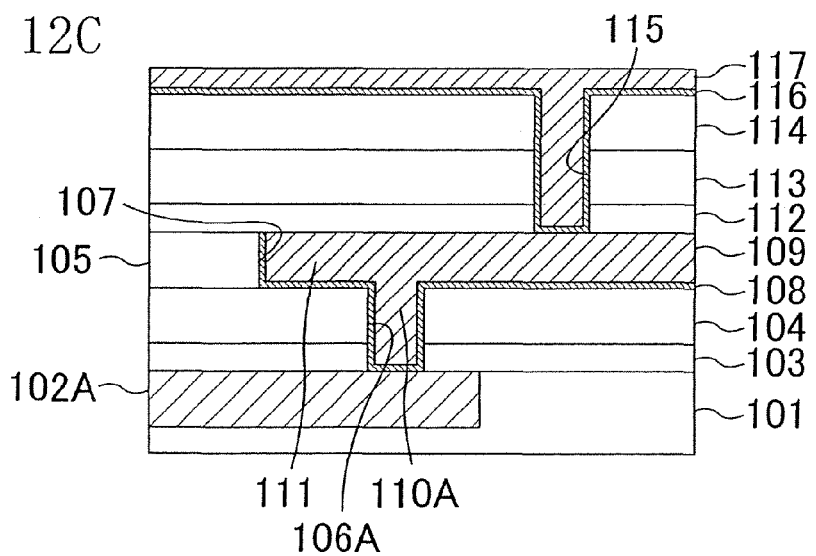

Then, as shown in FIG. 12C, a barrier film 116 is formed by, for example, a PVD process to partly fill the dummy hole 115. Thereafter, a Cu film 117 is formed by, for example, a plating process on the barrier film 116 to completely fill the dummy hole 115.

Subsequently, as shown in FIG. 13A, parts of the barrier film 116 and the Cu film 117 extending off the dummy hole 115 are removed by, for example, a CMP process. In this manner, a dummy via 118 connected to the second interconnect 111 is formed in the dummy hole 115.

Lastly, a SiN film 119 is deposited over the FSG film 114 and the dummy via 118 (the Cu film 117), thus completing the multilevel interconnection structure shown in FIG. 13B.

With the foregoing interconnection structure and the method for forming the structure according to the fifth embodiment, a highly-reliable multilevel interconnection structure which does not cause malfunction even when held at high temperature is implemented. This is because of the following reasons. The dummy via 118 is provided on the second interconnect 111 near the via 110A, so that vacancies in a part of the conductive film (the Cu film 109) constituting the second interconnect 111 are divided and respectively attracted to the via 110A and the dummy via 118. Specifically, in a portion of the second interconnect 111 connected to the dummy via 118, tensile stress on a part of the Cu film 109 constituting the second interconnect 111 is lower than that on its surrounding portions. Accordingly, vacancies inside the Cu film 109 are attracted to the dummy via 118, so that even when the interconnection structure is held at high temperature, flowing of vacancies from the second interconnect 111 into the via 110A is suppressed. As a result, plastic deformation of a part of the conductive film (the Cu film 109) constituting the via 110A, i.e., occurrence of a void inside the via hole 106A, is suppressed, so that a highly-reliable multilevel interconnection structure which does not cause malfunction even when held at high temperature is implemented.

In the fifth embodiment, the space between the via 110A and the dummy via 118 (i.e., the space between the via hole 106A and the dummy hole 115: hereinafter referred to as a via-to-dummy via space) is preferably as small as possible. To obtain the effect of reducing the number of vacancies flowing into the via 110A by using the dummy via 118, the via-to-dummy via space is preferably 25 µm or less and is more preferably 1 µm or less. The minimum via-to-dummy via space can be set in accordance with the minimum isolation width (e.g., 0.2 µm) between interconnects or vias defined by the design rule, for example. If the minimum isolation width between interconnects is set substantially equal to the minimum interconnect width, the minimum via-to-dummy via space may be set in accordance with the minimum interconnect width.

In the fifth embodiment, the number of dummy vias 118 provided for one via 110A is preferably as large as possible. Specifically, it is preferable to provide dummy vias 118 as many as possible on a part of the second interconnect 111 where the dummy vias 118 do not affect circuit operation.

In the fifth embodiment, the top of the dummy via 118 is located in the insulating films. Alternatively, the top of the dummy via 118 may be connected to a dummy interconnect. In such a structure, after a hole for forming the dummy via 118 has been formed by etching, etching for forming a dummy interconnect trench is performed, thus ensuring removal of residues of the insulating film remaining on the bottom of the hole. Accordingly, connection of the dummy via 118 to the second interconnect 111 is ensured, resulting in that advantages of this embodiment are also obtained in this case.

In the fifth embodiment, if the diameter of the dummy via 118 (the dummy hole 115) is smaller than that of the via 110A (the via hole 106A), advantages similar to those of the third embodiment are obtained.

In addition, in the fifth embodiment, if the dummy via 118 is rectangular in a plan view and the length of this dummy via 118 and the width of the second interconnect 111 are provided along the same direction in the plan view, advantages similar to those of the fourth embodiment are obtained. In such a case, the dummy via 118 is preferably closer to the center of the second interconnect 111 than the via 110A is. In other words, if the distance between the via 110A and the end of the second interconnect 111 opposite the via 110A with respect to the dummy via 118 is longer than the distance between the via 110A and the other end of the second interconnect 111, i.e., the end of the second interconnect 111 toward the via 110A, the foregoing advantages become more remarkable. In such a case, the planar shape of the via hole 106A (the via 110A) is not specifically limited, and may be a circle or a square, for example.

Embodiment 6

Insulating Slit 1

Hereinafter, an interconnection structure and a method for forming the structure according to a sixth embodiment of the present invention will be described with reference to the drawings.

Figure 15A:
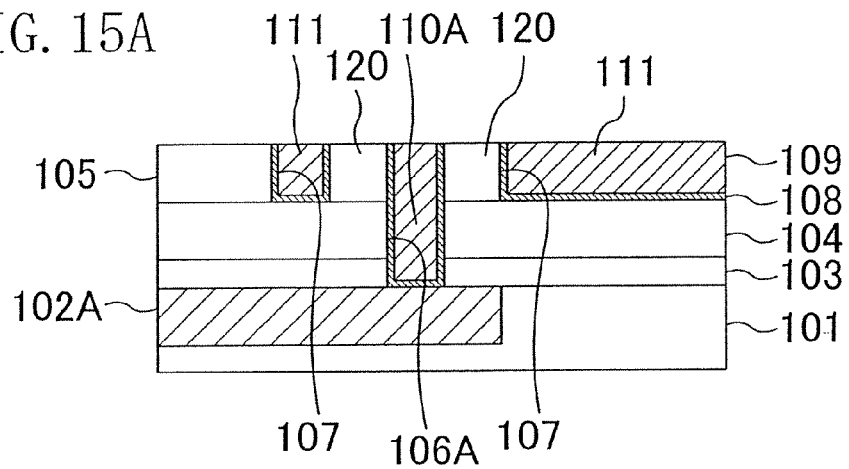
FIGS. 15A and 15B are cross-sectional views showing respective process steps of the method for forming the interconnection structure of the sixth embodiment.
Figure 15B:
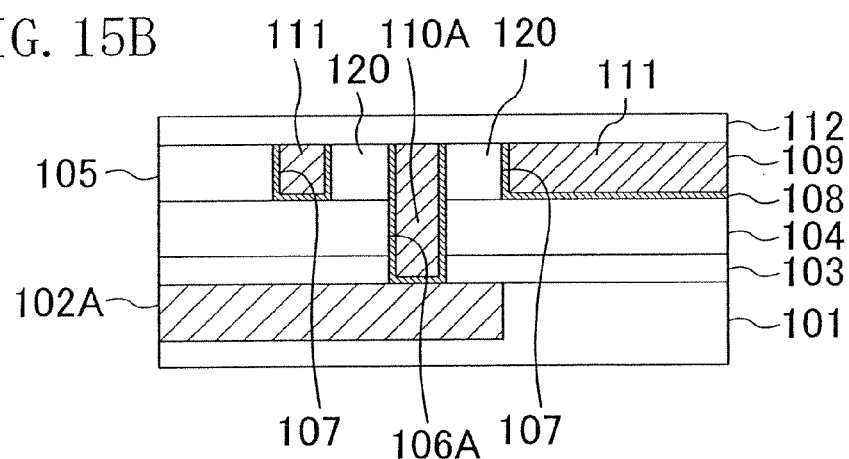
Figure 15C:
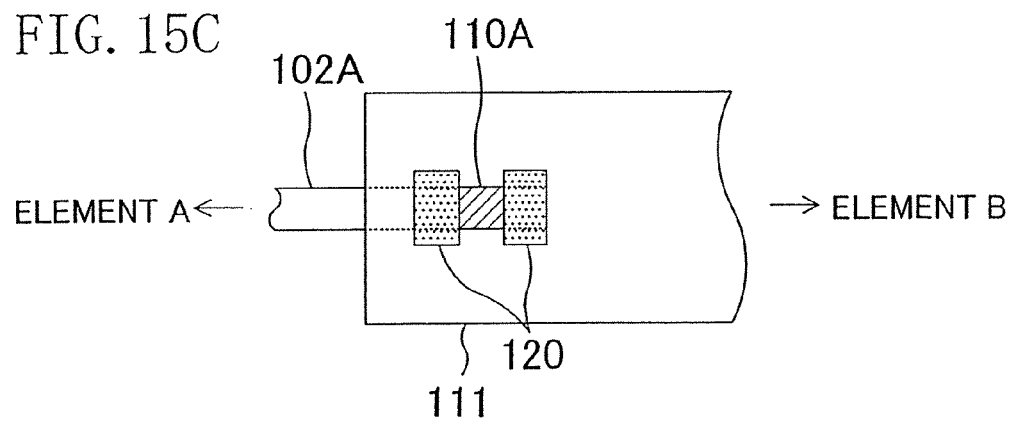
FIG. 15C is a plan view showing the interconnection structure of the sixth embodiment.

FIG. 15B is a cross-sectional view showing the interconnection structure of the sixth embodiment. FIG. 15C is a plan view showing the multilevel interconnection structure shown in FIG. 15B when viewed from above. In FIGS. 15B and 15C, components already described in the first embodiment with reference to FIGS. 1A through 1C and 2A through 2C or the second embodiment with reference to FIGS. 6A through 6C and 7A through 7C, for example, are denoted by the same reference numerals, and detailed description thereof will be omitted.

As shown in FIGS. 15B and 15C, a first interconnect 102A is buried in an insulating film 101 formed on a semiconductor substrate (not shown), and a SiN film 103, a $SiO_2$ film 104 and an FSG film 105 are formed in this order over the insulating film 101 and the first interconnect 102A. A via hole 106A is formed through the $SiO_2$ film 104 and the SiN film 103 to reach the first interconnect 102A. An interconnect trench 107 is formed through the FSG film 105 to reach the via hole 106A. A barrier film 108 and a Cu film 109 are buried in this order in the via hole 106A and the interconnect trench 107, thereby forming a via 110A and a second interconnect 111 in the via hole 106A and the interconnect trench 107, respectively.

A characteristic of this embodiment is that a pair of insulating slits 120 is provided in the second interconnect 111 to sandwich a portion of the second interconnect 111 connected to the via 110A (a portion of the second interconnect 111 on the via 110A.) In this embodiment, the insulating slits 120 are made of part of the FSG film 105 as an interlayer dielectric film. A SiN film 112 is formed over the FSG film 105 including the insulating slits 120 and the second interconnect 111.

As shown in FIG. 15C, in this embodiment, the first interconnect 102A has a width smaller than that of the second interconnect 111. Specifically, the width of the first interconnect 102A is, for example, 0.2 µm, the diameter of the via 110A (the via hole 106A) is, for example, 0.20 µm, and the width of the second interconnect 111 is, for example, 10 µm. The shape of each of the insulating slits 120 is rectangular in a plan view, and the length of each of the insulating slits 120 is greater than or equal to twice and less than or equal to four times as large as the diameter of the via 110A in the plan view. For example, the length and width of each of the insulating slits 120 in the plan view is 0.4 µm and 0.2 µm, respectively. In this embodiment, a longer side of each of the insulating slits 120 is in contact with the portion of the second interconnect 111 connected to the via 110A.

FIGS. 14A through 14C and FIG. 15A are cross-sectional views showing respective process steps of a method for forming the multilevel interconnection structure shown in FIG. 15B according to the sixth embodiment.

Figure 14A:
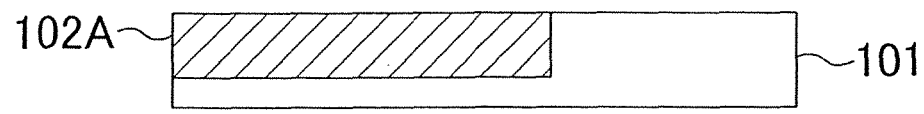
FIGS. 14A through 14C are cross-sectional views showing respective process steps of a method for forming an interconnection structure according to a sixth embodiment of the present invention.

First, as shown in FIG. 14A, an insulating film 101 is formed on the surface of a semiconductor substrate (not shown), and then a first interconnect 102A is formed in the insulating film 101.

Figure 14B:
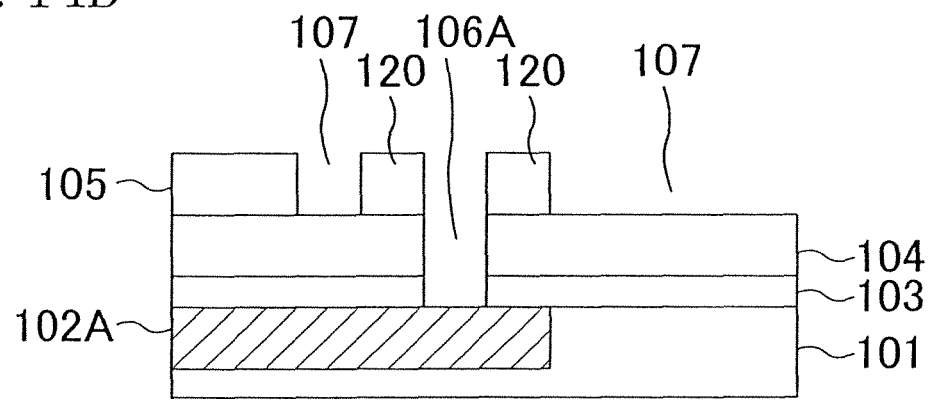

Next, as shown in FIG. 14B, a SiN film 103, a $SiO_2$ film 104 and a FSG film 105 are formed in this order over the insulating film 101 and the first interconnect 102A by a plasma CVD process, for example. Thereafter, lithography and dry etching are alternately performed twice (i.e., lithography and dry etching are each performed twice), thereby forming a via hole 106A in the $SiO_2$ film 104 and the SiN film 103 to reach the first interconnect 102A and also forming an interconnect trench 107 in contact with the via hole 106A in the FSG film 105. In this embodiment, in forming the interconnect trench 107, part of the FSG film 105 is left in the interconnect trench 107 to surround the via hole 106A, thereby forming insulating slits 120. Specifically, in a lithography process for forming the interconnect trench 107, a resist pattern covering not only the part of the FSG film 105 except for a region where the interconnect trench 107 is to be formed but also a part of the FSG film 105 to be the insulating slits 120 is used. Then, the FSG film 105 is etched using the resist pattern as a mask.

Figure 14C:
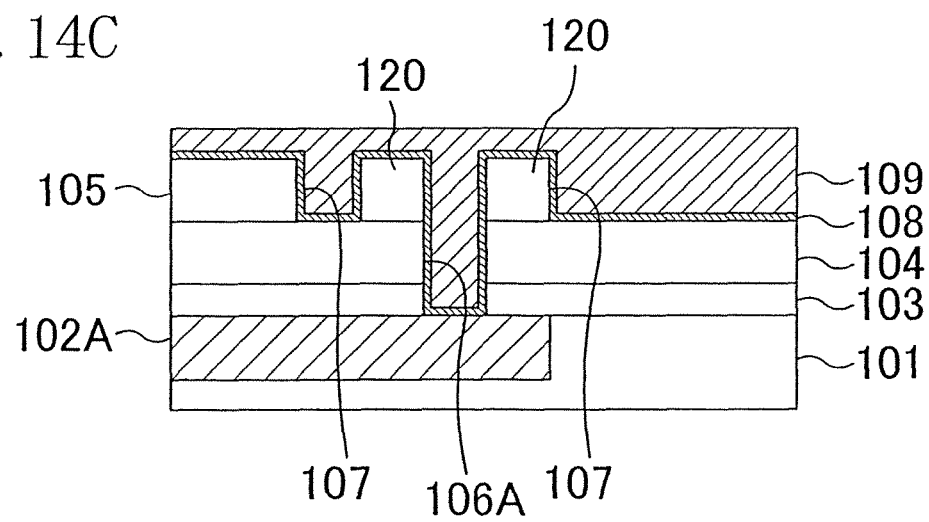

Then, as shown in FIG. 14C, a barrier film 108 is deposited by a PVD process, for example, to partly fill the via hole 106A and the interconnect trench 107. Then, a Cu film 109 is formed by a plating process, for example, on the barrier film 108 to completely fill the via hole 106A and the interconnect trench 107.

Thereafter, as shown in FIG. 15A, parts of the barrier film 108 and the Cu film 109 extending off the interconnect trench 107 are removed by a CMP process, for example. In this manner, a second interconnect 111 is formed in the interconnect trench 107. In addition, a via 110A is formed in the via hole 106A to connect the first interconnect 102A and the second interconnect 111 to each other.

Lastly, a SiN film 112 is deposited over the FSG film 105 including the insulating slits 120 and the second interconnect 111 (the Cu film 109), thus completing the multilevel interconnection structure shown in FIG. 15B.

With the foregoing interconnection structure and the method for forming the structure according to the sixth embodiment, a highly-reliable multilevel interconnection structure which hardly causes malfunction even when held at high temperature is implemented. This is because of the following reasons. The insulating slits 120 are provided near a portion of the second interconnect 111 connected to the via 110A. This portion of the second interconnect 111 will be also referred to as a via-connected portion. Specifically, the insulating slits 120 are provided in the second interconnect 111 to be in contact with the via-connected portion of the second interconnect 111. Accordingly, tensile stress on a part of the second interconnect 111 near the via-connected portion is lower than that on the other part of the second interconnect 111. The insulating slits 120 reduce the number of vacancies flowing into each via, so that the stress gradient from the second interconnect 111 to the via 110A is reduced, so that even when the interconnection structure is held at high temperature, flowing of vacancies from the second interconnect 111 into the via 110A is suppressed. In addition, the insulating slits 120 are made of a material different from that for the conductive film (the Cu film 109) constituting the second interconnect 111 and the via 110A, so that the insulating slits 120 act as barriers against movement of atoms or vacancies in the conductive film. This prevents convection of atoms inside the second interconnect 111 and the via 110A or accumulation of vacancies on the bottom of the via 110A. As a result, plastic deformation of a part of the conductive film (the Cu film 109) constituting the via 110A, i.e., occurrence of a void inside the via hole 106A, is suppressed, so that a highly-reliable multilevel interconnection structure which hardly causes malfunction even when held at high temperature is implemented.

Figure 16:
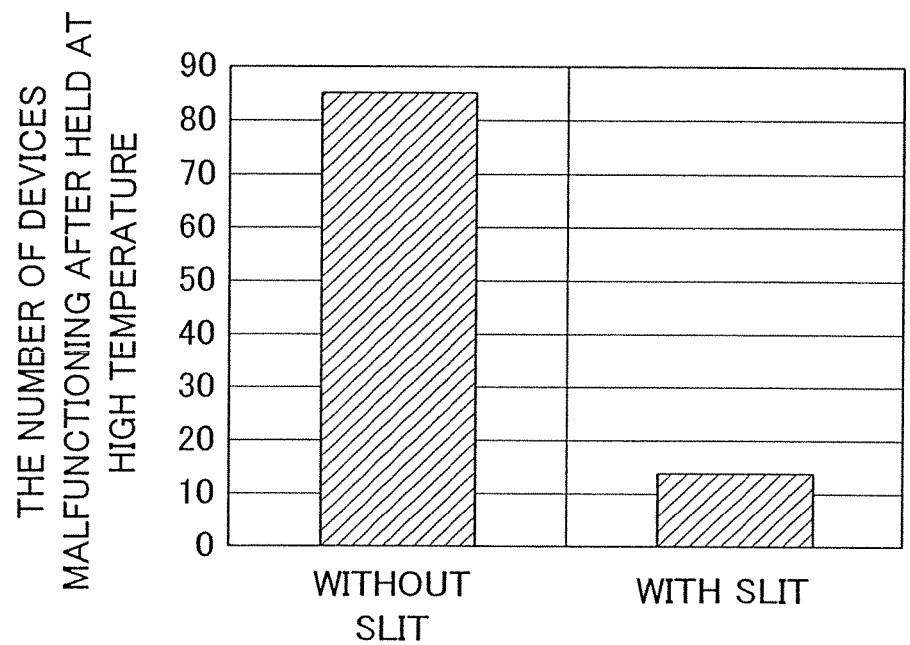
FIG. 16 is a graph showing an effect achieved by the sixth embodiment (i.e., the effect of suppressing malfunction after a device has been held at high temperature).

FIG. 16 is a graph for explaining effects of this embodiment. In FIG. 16, the ordinate indicates "the number of devices malfunctioning after being held at high temperature" and the abscissa indicates "the presence of an insulating slit". The case of "with slit" corresponds to this embodiment and the case of "without slit" corresponds to a conventional example. As shown in FIG. 16, in the case of "with insulating slit" in this embodiment, "the number of devices malfunctioning when being held at high temperature" is reduced to about one-eighth of that in the case of "without slit". This is because a slit made of an insulating film prevents a phenomenon in which atoms in a conductive film for interconnection move and vacancies in the conductive film gather in a via. Specifically, if a slit made of an insulating material different from a material for an interconnect is present in an conductive film for interconnection, this slit acts as a barrier against movement of atoms in the conductive film and also suppresses formation of a void resulting from gathering of vacancies from the conductive film in a via. Accordingly, in the case of "with insulating slit" in this embodiment, the number of devices malfunctioning when being held at high temperature" is reduced.

In addition, in the sixth embodiment, each of the insulating slits 120 is rectangular in a plan view. The length of each of the insulating slits 120 is greater than or equal to twice and less than or equal to four times as large as the diameter of the via 110A in the plan view. A longer side of each of the respective insulating slits 120 in the plan view is in contact with a portion of the second interconnect 111 connected to the via 110A. Accordingly, the foregoing advantages are ensured.

In the sixth embodiment, the shape and the number of the insulating slits 120 (the number of the insulating slits 120 provided for one via 110A) are not specifically limited.

In the sixth embodiment, part of the FSG film 105 is used as the insulating slits 120. Alternatively, other insulating materials may be used instead. The insulating slits 120 may be replaced with slits made of another conductive material different from a conductive material constituting the second interconnect 111 and the via 110A.

Further, in the sixth embodiment, the insulating slits 120 are not necessarily in contact with the portion of the second interconnect 111 connected to the via 110A. However, in a case where the insulating slits 120 and the via-connected portion of the second interconnect 111 are apart from each other, the space between each of the insulating slits 120 and the via-connected portion of the second interconnect 111, i.e., the space between each of the insulating slits 120 and the via 110A, is preferably 1 μm or less in order to ensure the foregoing advantages.

Furthermore, in the sixth embodiment, in a case where the second interconnect 111 includes: a wide interconnect portion having a width of about 10 μm, for example; and a narrow interconnect portion having a width of about 0.20 μm or less, for example, and branching off from the wide interconnect portion and if the via 110A (the via hole 106A) is connected to the narrow interconnect portion, one or more insulating slits 120 are preferably connected to the branch point between the wide interconnect portion and the narrow interconnect portion or a part of the wide interconnect portion near the branch point. Then, vacancies which are to enter the narrow interconnect portion from the wide interconnect portion and flow into the via 110A are effectively captured in the insulating slits 120. As a result, the number of devices malfunctioning when being held at high temperature is further reduced.

Embodiment 7

Insulating Slit 2

Hereinafter, an interconnection structure and a method for forming the structure according to a seventh embodiment of the present invention will be described with reference to the drawings.

Figure 17A:
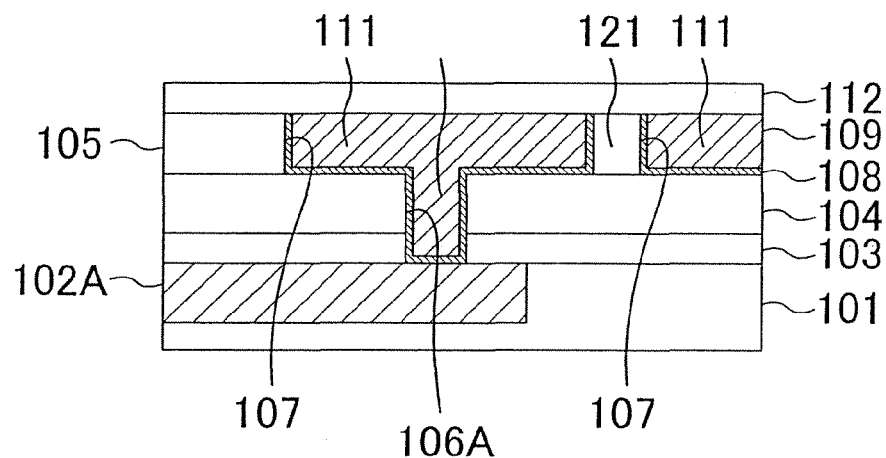
FIG. 17A is a cross-sectional view showing an interconnection structure according to a seventh embodiment of the present invention.
Figure 17B:
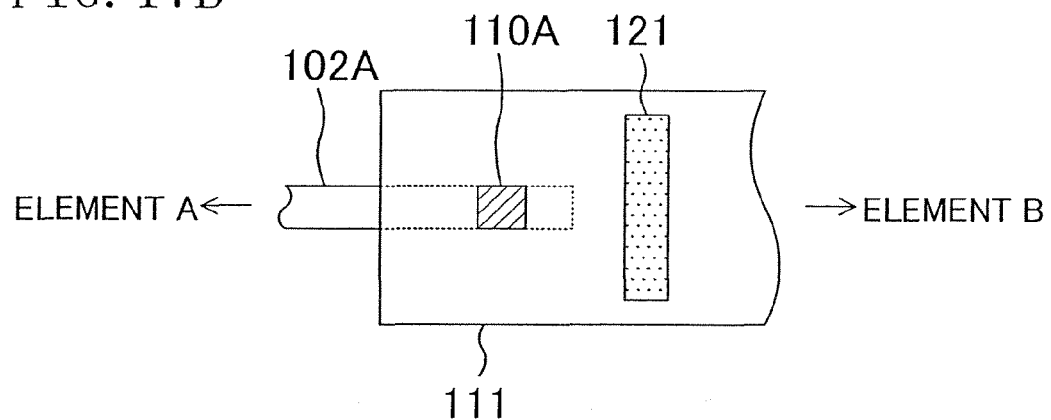
FIG. 17B is a plan view showing the interconnection structure of the seventh embodiment.
Figure 18A:
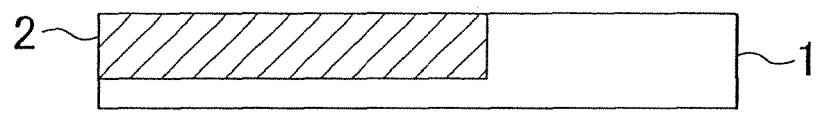
FIGS. 18A through 18C are cross-sectional views showing respective process steps of a conventional method for forming an interconnection structure.
Figure 18B:
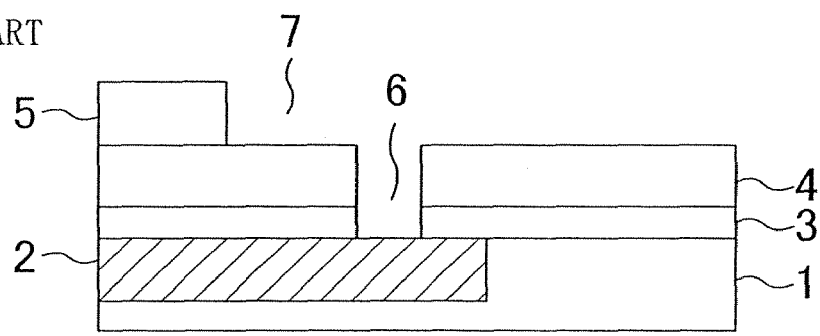
Figure 18C:
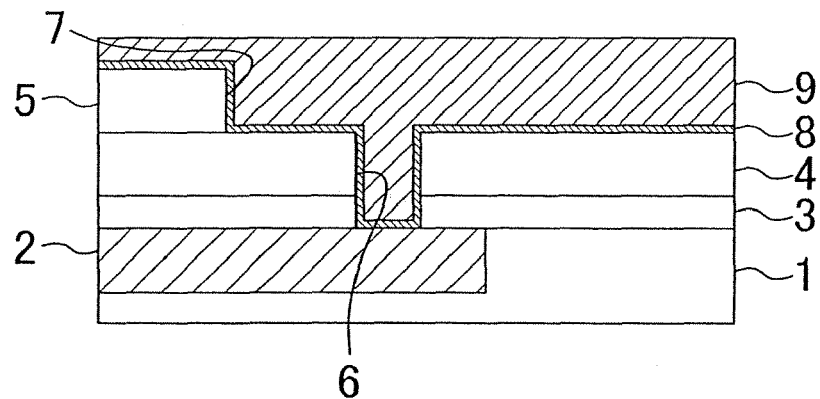
Figure 19A:
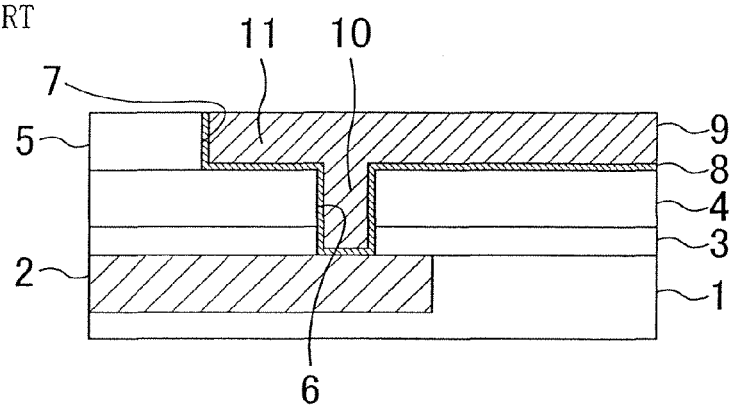
FIGS. 19A and 19B are cross-sectional views showing respective process steps of the conventional method for forming an interconnection structure.
Figure 19B:
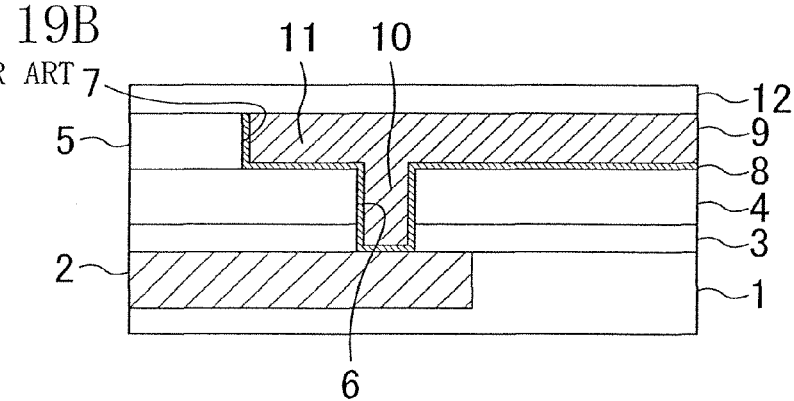
Figure 19C:
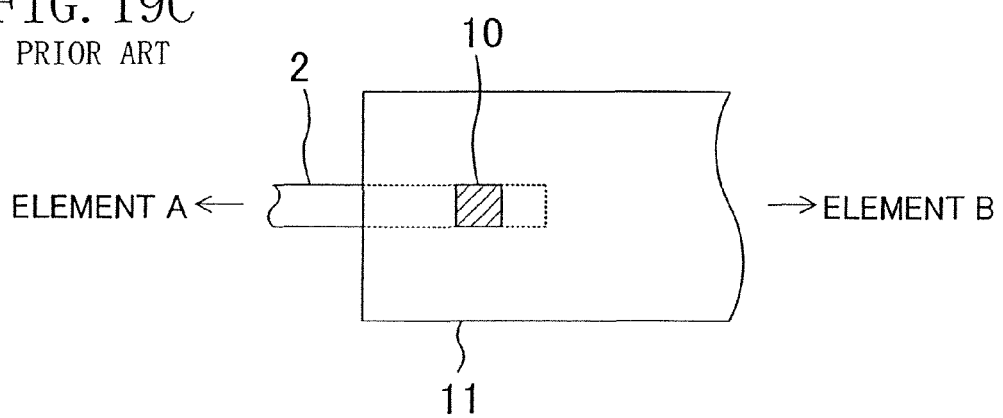
FIG. 19C is a plan view showing the conventional interconnection structure.

FIG. 17A is a cross-sectional view showing the interconnection structure of the seventh embodiment. FIG. 17B is a plan view showing the multilevel interconnection structure shown in FIG. 17A when viewed from above. In FIGS. 17A and 17B, components already described in the first embodiment with reference to FIGS. 1A through 1C and 2A through 2C or the sixth embodiment with reference to FIGS. 14A through 14C and 15A through 15C, for example, are denoted by the same reference numerals, and detailed description thereof will be omitted.

As shown in FIGS. 17A and 17B, the seventh embodiment is different from the sixth embodiment in the following ways. Instead of the insulating slits 120 in contact with a portion of the second interconnect 111 connected to the via 110A, an insulating slit 121 longer than the insulating slits 120 is provided in the second interconnect 111 near the via-connected portion of the second interconnect 111. In other words, the insulating slit 121 of this embodiment is not in contact with the via-connected portion of the second interconnect 111. Specifically, the insulating slit 121 is rectangular, for example, in a plan view and the length of the insulating slit 121 and the width of the second interconnect 111 are provided along the same direction in the plan view. The insulating slit 121 is provided in the second interconnect 111 near a portion of the second interconnect 111 connected to the via 110A (the via hole 106A) and is closer to the center of the second interconnect 111 than the via 110A is. In other words, the distance between the via 110A and the end of the second interconnect 111 opposite the via 110A with respect to the insulating slit 121 is longer than the distance between the via 110A and the other end of the second interconnect 111, i.e., the end of the second interconnect 111 toward the via 110A.

As shown in FIG. 17B, in this embodiment, the first interconnect 102A has a width smaller than that of the second interconnect 111. Specifically, the width of the first interconnect 102A is, for example, 0.2 μm, the diameter of the via 110A (the via hole 106A) is, for example, 0.20 μm, and the width of the second interconnect 111 is, for example, 10 μm. The length of the insulating slit 121 is greater than or equal to twice and less than or equal to ten times as large as the diameter of the via 110A in a plan view. For example, the length and width of the insulating slit 121 in the plan view is 0.8 μm and 0.2 μm, respectively. The space between the via 110A and the insulating slit 121, more specifically, the space between the edge of the via 110A toward the insulating slit 121 and the edge of the insulating slit 121 toward the via 110A is 0.2 μm, for example.

A method for forming the multilevel interconnection structure shown in FIG. 17A according to the seventh embodiment is different from that of the sixth embodiment (see FIGS. 14A through 14C, 15A and 15B) in the following ways. In the process step shown in FIG. 14B, more specifically, in forming the interconnect trench 107, part of the FSG film 105 is left in the interconnect trench 107 to be slightly apart from the via hole 106A, thereby forming the insulating slit 121 longer than the insulating slit 120, instead of the insulating slit 120. Specifically, in a lithography process for forming the interconnect trench 107, the layout of a mask pattern for forming the insulating silt only needs to be changed.

With the foregoing interconnection structure and the method for forming the structure according to the seventh embodiment, a highly-reliable multilevel interconnection structure which does not cause malfunction even when held at high temperature is implemented. This is because of the following reasons. The insulating slit 121 is provided near a portion of the second interconnect 111 connected to the via 110A, so that tensile stress on a portion near the via-connected portion of the second interconnect 111 is lower than that on the other part of the second interconnect 111. The insulating slit 121 reduces the number of vacancies flowing into each via, so that the stress gradient from the second interconnect 111 to the via 110A is reduced. Accordingly, even when the interconnection structure is held at high temperature, flowing of vacancies from the second interconnect 111 into the via 110A is suppressed. In addition, the insulating slit 121 is made of a material different from that for the conductive film (the Cu film 109) constituting the second interconnect 111 and the via 110A, so that the insulating slit 121 acts as a barrier against movement of atoms or vacancies in the conductive film. This prevents convection of atoms inside the second interconnect 111 and the via 110A or accumulation of vacancies on the bottom of the via 110A. As a result, plastic deformation of a part of the conductive film (the Cu film 109) constituting the via 110A, i.e., occurrence of a void inside the via hole 106A, is suppressed, so that a highly-reliable multilevel interconnection structure which hardly causes malfunction even when held at high temperature is implemented.

In the seventh embodiment, the reliability of the multilevel interconnection structure is further enhanced because of the following reasons. In this embodiment, the insulating slit 121 is rectangular in a plan view and the length of the insulating slit 121 and the width of the second interconnect 111 are provided along the same direction in the plan view. The insulating slit 121 is located near the portion of the second interconnect 111 connected to the via 110A. Accordingly, flowing of vacancies which are present in a part of the conductive film (the Cu film 109) constituting the second interconnect 111 opposite the via 110A with respect to the insulating slit 121 is blocked by the insulating slit 121, so that these vacancies do not reach the via 110A. In addition, in this embodiment, the insulating slit 121 is closer to the center of the second interconnect 111 than the via 110A is. In other words, a first region in the second interconnect 111 between the via 110A and the end of the second interconnect 111 opposite the via 110A with respect to the insulating slit 121 is larger than a second region in the second interconnect 111 between the via 110A and the other end of the second interconnect 111, i.e., the end of the second interconnect 111 toward the via 110A. Therefore, the first region contains a larger number of vacancies than the second region. In addition, the insulating slit 121 is provided in this first region, so that movement of vacancies is more effectively prevented. This more effectively suppresses plastic deformation of the part of the conductive film (the Cu film 109) constituting the via 110A, i.e., occurrence of a void in the via hole 106A. As a result, the reliability of the resultant multilevel interconnection structure is further enhanced.

In the seventh embodiment, the space between the via 110A (the via hole 106A) and the insulating slit 121 is preferably as small as possible. To obtain the effect of reducing the number of vacancies flowing into the via 110A by using the insulating slit 121, this space is preferably 1 µm or less. The insulating slit 121 may be in contact with a portion of the second interconnect 111 connected to the via 110A.

In the seventh embodiment, the shape and the number of the insulating slit 121 (the number of insulating slits 121 provided for one via 110A) are not specifically limited.

In the seventh embodiment, part of the FSG film 105 is used as the insulating slit 121. Alternatively, other insulating materials may be used. The insulating slit 121 may be replaced with a slit made of another conductive material different from a conductive material constituting the second interconnect 111 and the via 110A.

Moreover, in the seventh embodiment, if the second interconnect 111 includes a wide interconnect portion having a width of, for example, about 10 µm and a narrow interconnect portion having a width of, for example, about 0.20 µm or less and branching off from the wide interconnect portion and if the via 110A (the via hole 106A) is connected to the narrow interconnect portion, the insulating slit 121 is preferably connected to the wide interconnect portion near the branch point between the wide interconnect portion and the narrow interconnect portion. In such a case, if the narrow interconnect portion extends from a longer side of the wide interconnect portion, the length of the insulating slit 121 and the length of the wide interconnect portion are provided along the same direction in the plan view. Then, vacancies which are to enter the narrow interconnect portion from the wide interconnect portion and flow into the via 110A are effectively captured in the insulating slit 121. As a result, the number of devices malfunctioning when held at high temperature is further reduced.

In the first through seventh embodiments, a $SiO_2$ film (e.g., the $SiO_2$ film 104) and an FSG film (e.g., the FSG film 105) are used as interlayer dielectric films between interconnects. However, the types of the interlayer dielectric films are not specifically limited.

In the first through seventh embodiments, a Cu film (e.g., the Cu film 109) is used as an interconnect material. However, the type of the interconnect material is not specifically limited. A material for a barrier film (e.g., the barrier film 108) is not specifically limited, either.

In the first through seventh embodiments, a SiN film (e.g., the SiN film 112) is formed as a protective film over a damascene interconnect (e.g., the first interconnect 102A or the second interconnect 111). However, this SiN film may not be formed.

The dummy vias and the insulating slits of the first through seventh embodiments may be, of course, combined in various manners in order to achieve a technical idea of the present invention, "movement of vacancies in a conductive film for an interconnect is suppressed so that occurrence of a void in the interconnect after formation thereof is prevented."

What is claimed is:
1. A semiconductor device comprising:
a first interconnect;
a second interconnect formed over the first interconnect;
a via electrically connecting between the first and second interconnects; and
a dummy via electrically connected to the second interconnect, wherein the dummy via is made of a conductive film and is arranged so as to be incapable of having current flow therethrough.

2. The semiconductor device of claim 1 further comprising an insulating film formed under the first interconnect, wherein the dummy via is connected to a first dummy interconnect formed on the insulating film.

3. The semiconductor device of claim 2, wherein the first dummy interconnect has a width smaller than that of the second interconnect.

4. The semiconductor device of claim 2, wherein a width of the first dummy interconnect and a width of the first interconnect are substantially equal to each other.

5. The semiconductor device of claim 2, wherein the dummy via is substantially circular in a plan view, and a diameter of the dummy via is substantially equal to a width of the first dummy interconnect.

6. The semiconductor device of claim 2, wherein a planar shape of the dummy via is substantially a square, and a side of the dummy via is substantially equal to a width of the first dummy interconnect.

7. The semiconductor device of claim 2, wherein each of the first interconnect and the first dummy interconnect is buried in an upper portion of the insulating film.

8. The semiconductor device of claim 2, wherein a longer side of the first interconnect and a longer side of the first dummy interconnect form substantially a right angle.

9. The semiconductor device of claim 2, wherein the dummy via is substantially circular in a plan view, and a diameter of the dummy via is smaller than a width of the first dummy interconnect.

10. The semiconductor device of claim 2, wherein a planar shape of the dummy via is substantially a square, and a side of the dummy via is smaller than a width of the first dummy interconnect.

11. The semiconductor device of claim 1, further comprising an insulating film formed between the first interconnect and the second interconnect, wherein the insulating film has a multilayer structure including a SiN film and a SiO$_2$ film.

12. The semiconductor device of claim 1, wherein the second interconnect includes a first barrier film and a first conductive film.

13. The semiconductor device of claim 12, wherein the first conductive film includes copper.

14. The semiconductor device of claim 1, wherein each of the first and second interconnects is connected to another element or an external electrode.

15. The semiconductor device of claim 1, wherein the first interconnect, the second interconnect and the via constitute part of a closed circuit, and the dummy via does not constitute a closed circuit.

16. The semiconductor device of claim 1, wherein the first interconnect has a width smaller than that of the second interconnect.

17. The semiconductor device of claim 1, wherein the via and the dummy via are substantially circular in a plan view.

18. The semiconductor device of claim 17, wherein a diameter of the via and a diameter of the dummy via are substantially equal to each other.

19. The semiconductor device of claim 1, wherein a planar shape of each of the via and the dummy via is substantially a square.

20. The semiconductor device of claim 19, wherein a length of a side of the via and a length of a side of the dummy via are substantially equal to each other.

21. The semiconductor device of claim 1, wherein the first interconnect and the second interconnect extend in a same direction.

22. The semiconductor device of claim 1, wherein the dummy via is provided on an extended line along which the first interconnect extends.

23. The semiconductor device of claim 1, wherein the via is substantially circular in a plan view, and a diameter of the via is substantially equal to a width of the first interconnect.

24. The semiconductor device of claim 1, wherein a planar shape of the via is substantially a square, and a side of the via is substantially equal to a width of the first interconnect.

25. The semiconductor device of claim 1, wherein the via and the dummy via are spaced at a distance of 25 µm or less.

26. The semiconductor device of claim 1, wherein the via and the dummy via are spaced at a distance of 1 µm or less.

27. The semiconductor device of claim 1, wherein the distance between the via and the dummy via is substantially equal to a minimum interconnect width.

28. The semiconductor device of claim 1, wherein the dummy via is provided in plural.

29. The semiconductor device of claim 1, wherein the via and the dummy via are substantially circular in a plan view, and a diameter of the dummy via is smaller than a diameter of the via.

30. The semiconductor device of claim 1, wherein a planar shape of each of the via and the dummy via is substantially a square, and a side of the dummy via is smaller than a side of the via.

31. The semiconductor device of claim 1, wherein the dummy via is substantially rectangular in a plan view, and a longer side of the dummy via in a plan view and a shorter side of the second interconnect are provided along a same direction.

32. The semiconductor device of claim 1, wherein a distance between the via and one end of the second interconnect is shorter than a distance between the dummy via and the one end of the second interconnect and shorter than a distance between the via and the other end of the second interconnect.

33. The semiconductor device of claim 1, wherein the dummy via is connected to the upper surface of the second interconnect.

34. The semiconductor device of claim 33, wherein the dummy via is formed in an insulating film formed on the second interconnect.

35. The semiconductor device of claim 34, wherein the insulating film has a multilayer structure including a SiN film and a SiO$_2$ film.

36. The semiconductor device of claim 33, wherein the dummy via includes a second barrier film and a second conductive film.

37. The semiconductor device of claim 36, wherein the second conductive film includes copper.

38. The semiconductor device of claim 33, wherein a second dummy interconnect is provided on the dummy via so as to come in contact with a top of the dummy via.

39. The semiconductor device of claim 1, wherein the dummy via and the second interconnect are made of the same conductive film.

40. The semiconductor device of claim 1, wherein the dummy via and the second interconnect include a Cu film.

41. The semiconductor device of claim 1, wherein the dummy via includes a first and second end, the first end connected to the second interconnect and the second end surrounded by an insulating film.

42. The semiconductor device of claim 1, wherein the dummy via includes a first and second end, the first end connected to the second interconnect and the second end connected to a first dummy interconnect, the first dummy interconnect being surrounded by an insulating film.

43. The semiconductor device of claim 1, wherein a bottom of the dummy via is located deeper than a bottom of the via.

44. The semiconductor device of claim 1 further comprising an insulating film formed under the first interconnect,
wherein a bottom of the dummy via is located in the insulating film.

45. The semiconductor device of claim 1, wherein the second interconnect is comprised of a first interconnect portion and a second interconnect portion whose interconnect width is smaller than that of the first interconnect portion and which branches from the first interconnect portion, and the via is connected to the second interconnect portion.

46. The semiconductor device of claim 45, wherein the dummy via is formed at or near the branch point between the first and second interconnect portions.

47. The semiconductor device of claim 45, wherein a width of the second interconnect portion is 0.2 μm or less.

48. The semiconductor device of claim 45, wherein the dummy via is substantially rectangular in a plan view, and
a longer side of the dummy via and a longer side of the first interconnect portion are provided along a same direction.

* * * * *